(12) United States Patent
B A Jalil et al.

(10) Patent No.: US 7,960,757 B2
(45) Date of Patent: Jun. 14, 2011

(54) MAGNETO-ELECTRIC FIELD EFFECT TRANSISTOR FOR SPINTRONIC APPLICATIONS

(75) Inventors: Mansoor B A Jalil, Singapore (SG); Seng Ghee Tan, Singapore (SG); Tow Chong Chong, Singapore (SG); Yun Fook Liew, Singapore (SG); Kie Leong Teo, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 999 days.

(21) Appl. No.: 11/587,445

(22) PCT Filed: Apr. 27, 2004

(86) PCT No.: PCT/SG2004/000111
§ 371 (c)(1),
(2), (4) Date: Jul. 18, 2007

(87) PCT Pub. No.: WO2005/104240
PCT Pub. Date: Nov. 3, 2005

(65) Prior Publication Data
US 2011/0042720 A1    Feb. 24, 2011

(51) Int. Cl.
*H01L 29/82* (2006.01)
(52) U.S. Cl. .................................................. 257/194
(58) Field of Classification Search ............ 257/194, 257/E29.323, 192, 285, 213–413, 900, 902–903, 257/E21.19–E21.21, E21.394–E21.458, E21.615–E21.694, 257/68–71, 296–309, 905–908, E27.084–E27.097, E27.075, 295; 438/167, 172
See application file for complete search history.

(56) References Cited

U.S. PATENT DOCUMENTS
5,654,566 A * 8/1997 Johnson ................. 257/295
6,218,718 B1 * 4/2001 Gregg et al. ........... 257/421

FOREIGN PATENT DOCUMENTS
JP    2001093274 A    4/2001
JP    2003092412 A    3/2003

OTHER PUBLICATIONS

A. Cabbibo, et al., "Fabrication of spin-current field-effect transistor structures", American Vacuum Society, J. Vac. Sci. Technol. A, vol. 15, No. 3, pp. 1215-1219, May/Jun. 1997.

(Continued)

*Primary Examiner* — Dao H Nguyen
*Assistant Examiner* — Tram H Nguyen
(74) *Attorney, Agent, or Firm* — Davidson Berquist Jackson & Gowdey, LLP

(57) ABSTRACT

The present invention is directed to a magneto-electric field effect transistor comprising a channel region, a source connected to one side of the channel region and adapted to inject electrons into the channel region, a drain connected to the opposite side of the channel region and adapted to detect spin polarized electrons; and a gate comprising at least one magnetic double pair element comprising four magnetic elements each magnetic element being adapted to induce a magnetic field into the channel region, wherein the total induced magnetic field of the magnetic double pair element is controllable to be substantially zero, and wherein the gate is further adapted to induce an electrical field into the channel region.

22 Claims, 11 Drawing Sheets

OTHER PUBLICATIONS

Amlan Majumdar, "Effects of intrinsic spin on electronic transport through magnetic barriers", The American Physical Society, vol. 54, No. 17, pp. 11911-11913, Nov. 1, 1996.

E. I. Rashba & Al. L. Efros, "Orbital Mechanisms of Electron-Spin Manipulation by an Electric Field", The American Physical Society, vol. 91, No. 12, pp. 126405-1-126405-4, Sep. 19, 2003.

G. Papp & F. M. Peeters, "Spin filtering in a magnetic-electric barrier structure", American Institute of Physics, vol. 78, No. 15, pp. 2184-2186, Apr. 9, 2001.

H. Z. Xu and Y. Okada, "Does a magnetic barrier or a magnetic-electric barrier structure possess any spin polarization and spin filtering under zero bias?", American Institute of Physics, vol. 79, No. 19, pp. 3119-3121, Nov. 5, 2001.

International Search Report from Application No. PCT/SG2004/000111, mailed Apr. 1, 2005.

John Schliemann & Daniel Loss, "Anisotropic transport in a two-dimensional electron gas in the presence of spin-orbit coupling", The American Physical Society, vol. 68, pp. 165311-1-165311-9, Oct. 14, 2003.

John Schliemann, J. Carlos Egues, and Daniel Loss, "Nonballistic Spin-Field-Effect Transistor", The American Physical Society, vol. 90, No. 14, pp. 146801-1-146801-4, Apr. 11, 2003.

Jun-ichiro Inoue, Gerrit E. W. Bauer, and Laurens W. Molenkamp, "Diffuse transport and spin accumulation in a Rashba two-dimensional electron gas", The American Physical Society, vol. 67, pp. 033104-1-033104-4, Jan. 31, 2003.

Laurens W. Molenkamp et al., "Rashba Hamiltonian and electron transport", The American Physical Society, vol. 64, pp. 121202-1-121202-4, Sep. 4, 2001.

P.R. Hammar et al., "Observation of spin injection at a ferromagnet-semiconductor interface", The American Physical Society, vol. 83, No. 1, pp. 203-206, Jul. 5, 1999.

Supriyo Datta and Biswajit Das, "Electronic analog of the electro-optic modulator", American Institute of Physics, vol. 56, No. 7, pp. 665-667, Feb. 12, 1990.

Takaaki Koga, et al., "Rashba spin-orbit coupling probed by the weak antilocalization analysis in InAlAs/InGaAs/InAlAs quantum wells as a function of quantum well asymmetry", The American Physical Society, vol. 89, No. 4, pp. 046801-1-046801-4, Jul. 22, 2002.

Y. Jiang, M. B. A. Jalil, and T.S. Low, "Comment on Spin filtering in a magnetic-electric barrier structure" [Appl. Phys. Lett. 78, 2184 (2001)], American Institute of Physics, vol. 80, No. 9, pp. 1673-1674, Mar. 4, 2002.

Yong Guo, Binglin Gu, and Wenhui Duan, "Transport in asymmetric multiple-barrier magnetic nanostructures", The American Physical Society, vol. 55, No. 15, pp. 9314-9317, Apr. 15, 1997.

Yong Guo, et al., "Spin filtering in parallel magnetic-barrier structures", Institute of Physics Publishing, Semiconductor Science and Technology, pp. 297-299, Feb. 26, 2003.

* cited by examiner

MAGNETO-ELECTRIC FIELD EFFECT TRANSISTOR FOR SPINTRONIC APPLICATIONS

CROSS-REFERENCE TO RELATED APPLICATIONS

This application is the National Phase of International Application PCT/SG2004/000111 filed Apr. 27, 2004 which designated the U.S. and was published under PCT Article 21(2) in English. The entire contents of that application are herein incorporated by reference.

The invention relates generally to a field effect device. In particular, the inventions relates to a magneto-electric barrier field-effect transistor.

Spintronics, or spin electronics, refers to the study of the role played by electron spin in solid state physics, and possible devices that exploit the spin properties. One of the earliest proposals for a semiconductor spintronic device by Datta and Das was for a spin-polarized field-effect transistor (spin-FET) [1], in which the source and drain contacts are ferromagnetic materials intended to inject and detect spin-polarized electrons transported in a high-mobility channel. The conductance of the spin-FET would depend on electron spin orientation in the channel, which would be controlled by the gate voltage relative to the magnetization of the drain contact, producing a spin-based mode of operation.

Other early efforts on spintronics, relying on the injection of spin-polarized currents into semiconductor from either ferromagnetic metal or magnetic semiconductor, encounter the difficulty of conductivity mismatch in the case of using non-magnetic metal as spin aligner, and low Curie temperature in the case of using magnetic semiconductor.

Recent works [2, 3] showed that spin polarization (P) could be achieved by passing a current across a two-dimensional electron gas (2DEG) plane under the influence of spatially non-uniform, perpendicular-to-plane, magneto-electric barriers. However, computation [4, 5, 6] shows that anti-symmetric delta magnetic barriers cannot induce polarization. Subsequently, Yong et al. [7] shows that symmetric delta barriers, described in a single-electron Hamiltonian, are able to induce a small, net polarization. One way to increase the polarization might be to increase the number of such symmetric barriers. However, such attempt will lead also to low transmission probability (T) as the transmission probability will decrease with every single barrier crossed by the electron, as electron's potential or kinetic energy in x-direction is decreased by deflecting the electron into the y-direction and the remaining kinetic energy in x-direction may not be sufficient to surmount the magnetic barriers. Moreover, symmetric barriers are difficult to realize especially when many barriers are crossed.

From [8] a method for investigation of the values of the Rashba spin-orbit coupling constant is known. In [9] spin injection at a ferromagnet-semiconductor interface is observed. [10] discloses a method for deriving the diffusive conductance tensor for a disordered two-dimensional electron gas with spin-orbit interaction is known. In [11] a theory of spin manipulation of quasi-two-dimensional electrons by a time-dependent gate voltage applied to a quantum well is developed. [12] discloses a method for deriving the velocity operator for the Rashba-split conduction band. [13] discloses that in a two-dimensional electron gas the presence of spin-orbit coupling of both Rashba and Dresselhaus type leads to anisotropic dispersion relations and Fermi contours. In [14] a spin-field-effect transistor based on spin-orbit coupling of both Rashba and the Dresselhaus type is proposed. [15] discloses a hybrid magnetic spin injected-FET structure which can be used as a memory element for nonvolatile storage of digital information. [16] discloses a spin transistor in which a magnetically controllable barrier is provided between a semiconductor base and collector to control the diffusion of charge carriers to the collector.

Despite these research efforts it would be useful to have a spin-FET which increases spin-polarization of electrons injected into a channel region of the spin-FET without increasing the voltage applied to the gate, i.e. a spin-FET in which the polarization of the electrons is more sensitive to the voltage applied to the gate.

The present invention is directed to a magneto-electric field effect transistor comprising:
a channel region,
a source connected to one side of the channel region and adapted to inject electrons into the channel region,
a drain connected to the opposite side of the channel region and adapted to detect spin polarized electrons; and
a gate comprising at least one magnetic double pair element comprising four magnetic elements, wherein each magnetic element is adapted to induce a magnetic field into the channel region, wherein the total induced magnetic field of each magnetic double pair element is controllable to be substantially zero, and wherein the gate is further adapted to induce an electrical field into the channel region.

For the purpose of illustration, the invention can be embodied in a spintronic device in the form of a magneto-electric spin-FET that comprises a gate, a source and a drain. Other embodiments of the invention include, but are not limited to, a programmable non-volatile memory cell, a voltage amplifier, which can be operated at a very low voltage, a spin current source, a magnetic sensor, analog to digital converter, decoder and/or logic gates, i.e. programmable spin logic. Generally speaking the present invention can be embodied in any nano-device which can be gated, and which enables ballistic transport to take place, e.g. high-quality semiconductor nanowires and carbon nanotubes. The spintronic device is preferably based on a High Electron Mobility Transistor (HEMT) like multilayer, which is used to produce two-dimensional electron gas (2DEG) through which current flows from source to drain. The source functions as a current injector. The drain functions as a current receiver, current filter, spin detector, or resistance detector. The gate comprises material which is adapted to induce magnetization into the channel region. For inducing the magnetization the gate comprises at least one magnetic double pair element, i.e. at least four magnetic delta barriers are induced into the channel region. The spin polarization of the spintronic device is controlled by a combination of magnetic and electric barriers. The magnetic barriers are produced by the magnetization of the gate electrodes, while the electric barriers arise from the voltage bias applied on the gate. Varying electrical voltage at the gate causes a change in the spin polarization of the current.

In the present invention the terms "magnetic element" means an element which is suitable to generate a magnetic delta barrier, e.g. induce a magnetic delta barrier into a channel region of a spin-FET. Such a magnetic element can be a single pole writing head or a pole, i.e. a south pole or a north pole, of a magnet, e.g. of a permanent magnet or an electro magnet. In accordance with this definition a single permanent magnet can provide two magnetic elements, i.e. a pair of elements, since the south pole as well as the north pole of the permanent magnet can provide a magnetic delta barrier into the channel region of the spin-FET when the permanent magnet is aligned parallel to the channel region, i.e. a line connecting the north pole and the south pole of the permanent magnet is aligned parallel to the channel region. Accordingly, a magnetic double pair element comprises two pairs of magnetic elements and inducing four delta barriers.

In one embodiment the induced magnetic field is perpendicular to an interface surface between the gate and the channel region.

One advantage of the present invention is that in the presence of the perpendicular magnetic field (vertical B-field), the spin polarization is sensitive to a small variation of the voltage bias applied to the gate. The spin polarization is sensitive to a voltage change in the order of a few millivolts.

Preferably, the magnetic field induced by each magnetic double pair element is zero.

According to an embodiment of the present invention the magnetic barriers induced by the magnetic double pair element is of a so called "net zero A-Type" which means that the sum of all magnetic barriers induced by the magnetic double pair element is zero wherein "A" is the magnetic vector potential. For example, for one magnetic double pair element "net zero A-Type" means that the four magnetic delta barriers having magnetic field strengths $B_1$, $B_2$, $B_3$ and $B_4$, respectively and which are induced into the channel region by the magnetic double pair element sums up to zero, which means that $B_1+B_2+B_3+B_4=0$, wherein $B_1$, $B_2$, $B_3$ and $B_4$ are the magnetic fields in the z-direction.

Numerical computations show that in the presence of the vertical magnetic field, the spin polarization is sensitive to a small variation of the voltage bias applied on the gate. The magneto-electric spin-FET is thus a low voltage transistor, which can generate and manipulate spin-polarized current. The spin polarization of current in the spin-FET can also be converted to a change in the magneto-resistance of the source-drain channel. In this manner, the spin-FET can act as a current amplifier since it presents a variable and controllable resistance to current within the 2DEG.

According to an embodiment of the invention, the double-pair elements are designed to have a field configuration which is either anti-symmetric, in which case a gate voltage is applied to the spin-FET to produce a non-zero polarization, or symmetric, in which case a non-zero polarization is achieved without applying a gate voltage. However, in both cases the double-pair elements are designed to have a field configuration which having a zero net change in $A_y(x)$. In this way, the double-pair can be used to increase the polarization of the injected electrons without shifting the transmission threshold to higher electron energies.

Another advantage of the magneto-electric barrier field-effect transistor according to the present invention is, that the spin polarization can be increased by using a higher magnetic field, the gain characteristics of which can be controlled by other independent parameters, e.g. saturation magnetization of the gate material and/or magnetization alignment of the different magnetic barriers induced by the magnetic double-pair. These parameters are independent from the setup of the magneto-electric barrier field-effect transistor so that extra degrees of freedom are introduced into the use of the magneto-electric barrier field-effect transistor.

The spin-FET according to the invention can be used to generate highly polarized spin current and manipulate it, and can thus be a key component of spin-logic devices and circuitry, e.g. the spin-polarized current from the 2DEG, when fed to gate electrodes of other spin-FETs, can act as an input signal to these spin-FETs.

The spin-FET according to the invention can also be used as a non-volatile memory by itself and/or in a memory device because the spin-polarized currents, which the spin-FET produces, can be used to switch the magnetization of memory elements.

Furthermore, the spin-FET of the invention may operate at the high precession frequency, which is in the order of 30 GHz to 100 GHz, and is thus capable of operating with high frequency signals.

In one embodiment of the spin-FET of the invention the gate comprises a plurality of magnetic double pair elements. The use of multiple magnetic double pair elements increases the polarization of the electrons passing through the channel region. Every single magnetic double pair element increases the net polarization of the electrons. When using multiple magnetic double pair elements each single magnetic double pair element is of the net zero A-type. In principle, any suitable number of magnetic double pairs can be used as long as the resulting polarization is sufficiently high to be detected by the drain region of the magneto-electric field effect transistor. For example, such a polarization can be achieved by two, four, six, eight, ten or more magnetic double pairs. The upper limit be chosen depending on the desired sensitivity and/or depending on the desired size of the spin-FET of the invention. Accordingly, the number of magnetic double pairs as high as ten, fifteen, twenty, twenty five or twenty seven may be used in the spin-FET.

In another embodiment the source comprises or consists of a material selected of the group consisting of non-magnetic, ferromagnetic, half metal, or magnetic semiconductor. By using these materials it is possible to inject polarized or non polarized electrons into the channel region, which polarization can be increased by the magnetic double pair element of the gate.

In another embodiment the drain comprises or consists of a material selected of the group consisting of ferromagnetic, half metal, and magnetic semiconductor. These materials are suitable to detect spin-polarized electrons transported in the cannel region, i.e. a high-mobility channel. Thus, the drain can function as a current receiver, current filter, spin detector, or resistance detector.

In a further embodiment the channel region comprises a first layer consisting of $n^+$ doped Aluminum-Gallium-Arsenic, a second layer consisting of Aluminum-Gallium-Arsenic, and a third layer consisting of Gallium-Arsenic. Such a combination of sublayers of these materials for a channel region is suitable to generate a two-dimensional electron gas (2DEG) in the channel region of the magneto-electric field effect transistor.

In yet another embodiment of the Spin-FET of the invention the gate comprises a ferromagnetic material. Ferromagnetic materials are suitable to induce a perpendicular magnetic field into the channel region. Thus, these materials are preferred to be used as the material for the magnetic double pair elements according to the present invention. Examples of ferromagnetic materials that can be used in the present application include iron, cobalt and nickel or alloys comprising such elements. In one embodiment, the ferromagnetic material is preferably a corresponding alloy (or a mixture of such alloys) such as Cobalt-Chromium-Platinum and/or Iron-Platinum and/or Iron-Cobalt and/or Cobalt-Palladium. Materials such as these alloys are suitable to be magnetized in a high degree and thus induce a high magnetic field into the channel region. Therefore, the polarization of the electrons passing through the channel region can be easily increased.

In accordance with the above explanations, in some embodiments of the spin-FET of the invention the gate comprises at least ten magnetic double pair elements. In other embodiments the magnetic double pair element is formed by magnets whose poles are aligned substantially parallel to the channel region. Using of magnetic double pair elements aligned parallel to the channel region is one suitable manner to secure that the fringe field of the magnetic double pair element induce a substantially perpendicular magnetic field into the channel region. In such an embodiment a substantially parallel alignment means that the line between the magnetic north pole and the magnetic south pole of each magnet is substantially parallel to the direction of the channel region. For such an alignment the ferromagnetic materials used for the magnets is preferably iron, cobalt and nickel or alloys comprising such elements. In an illustrative way with such an alignment it is secured that each magnet induces two magnetic delta barriers into the channel region. Thus, a magnetic double pair element can be embodied by two magnets. In such an alignment each pole, i.e. each north pole and each south pole, of each pole induces one magnetic delta barrier. By using such an alignment a net zero A-type of each magnetic double pair can also be secured in an easy manner, since it is automatically secured that each magnet induces a net zero A-type pair of magnetic delta barriers. In the case that the two magnets which are forming one magnetic double pair element having a different strength of magnetization an asymmetric magnetic field is generated thus leading to a net polarization of the electrons passing through the channel region. In such an alignment a single magnetic double pair element can also comprise three magnets.

In another embodiment the magnetic double pair element is formed by magnets whose poles are aligned substantially perpendicular to the channel region. Using of magnetic double pair elements aligned perpendicular to the channel region is a preferred manner to secure that the field of the magnetic double pair element induce a perpendicular magnetic field into the channel region. In this embodiment a substantially perpendicular alignment means that the line between the magnetic north pole and the magnetic south pole of each magnet is substantially perpendicular to the direction of the channel region. In such an alignment the ferromagnetic material is preferably an alloy (or a mixture of such alloys) such as Cobalt-Chromium-Platinum and/or Iron-Platinum and/or Iron-Cobalt and/or Cobalt-Palladium. In an illustrative way with thus an alignment it is secured that each magnet induces one magnetic delta barrier into the channel region. Thus, a magnetic double pair element can be embodied by four magnets. In such an alignment each magnet, i.e. a north pole or a south pole of each magnet, induces one magnetic delta barrier. By using such an alignment a net zero A-type can be secured by using pairs of magnets having the same strength of magnetization. In such an alignment a magnetic double pair element inducing magnetic delta barriers of different strengths can be generated in an easy way since the strength of each single magnetic delta barrier of each magnetic double pair element can be independently set by using four individual magnets.

In yet another embodiment the gate comprises single pole writing heads, which are adapted to influence the perpendicular magnetic field induced by the magnetic double pair element into the channel region. Preferably the single pole writing head is used to write a perpendicular magnetic field onto the gate electrode so that a magnetization of the gate electrode can be changed.

Single pole writing heads are known elements in the computer field and are used for example in magnetic disk drives. The use of single pole writing heads is similar to the embodiment where a substantially perpendicular alignment of magnets is used. The use of single pole writing heads exhibit the further advantage that the strength of each single magnetic delta barrier can be varied, thus providing an additional degree of control of the spin polarization.

In a preferred embodiment the magneto-electric field effect transistor comprises further a layer of soft magnetic material under the channel region opposite to the gate.

The use of a soft magnetic underlayer under the channel increases the strength of the perpendicular magnetic field induced into the channel region and also enhance the orientation of the magnetic field induced by the magnetic double pair element, in particular in the embodiment in which the magnetic double pair element is formed by magnets whose poles are aligned substantially perpendicular to the channel region. Therefore, leading to an increased net polarization induced by each magnetic double pair and thus increases the polarization of the electrons passing through the channel region. The soft magnetic underlayer is used to strengthen the magnetic field $B_z$ and to enhance the orientation of the magnetic field $B_z$, i.e. the soft magnetic underlayer ensures, if necessary, that the B-field lines from the magnetic portions of the gate keep a perpendicular course as they cut through the 2DEG. Materials that are suitable as soft magnetic underlayer include, but are not limited to Iron-Cobalt-Boron, Cobalt-Zirconium-Niobium, Iron-Aluminum-Nitrogen, or Nickel-Iron like Permalloy ($Ni_{0.8}Fe_{0.2}$) or $Ni_{0.45}Fe_{0.55}$.

Preferably the channel region is a HEMT like channel region. Using a channel region which is similar to a channel region of a High Electron Mobility Transistor (HEMT) is an efficient manner to generate a two-dimensional electron gas in the channel regions.

In yet still another embodiment the strength of the magnetic field induced by the first magnetic delta barrier is $B_1$, the strength of the magnetic field induced by the second magnetic delta barrier is $B_2$, the strength of the magnetic field induced by the third magnetic delta barrier is $B_3$, and the strength of the magnetic field induced by the forth magnetic delta barrier is $B_4$, wherein $B_1$, $B_2$, $B_3$, and $B_4$ have the following relation to each other:

$$|B_2|=|B_3|, |B_1|=|B_4| \text{ and } |B_1|\neq|B_2|.$$

By using such a relation between the strengths between the four magnetic delta barriers induced by a single magnetic double pair element inducing of a perpendicular magnetic field induced into the channel region is of the net zero A-type is secured, whereby it is secured that a net polarization of the electrons passing through the channel is generated by each magnetic double pair element. $B_1$, $B_2$, $B_3$, and $B_4$ are all measured in the z-direction, i.e. the direction perpendicular to the channel region.

In an alternative embodiment the strength of the magnetic field induced by the first magnetic delta barrier is $B_1$, the strength of the magnetic field induced by the second magnetic delta barrier is $B_2$, the strength of the magnetic field induced by the third magnetic delta barrier is $B_3$, and the strength of the magnetic field induced by the forth magnetic delta barrier is $B_4$, wherein $B_1$, $B_2$, $B_3$, and $B_4$ have the following relation to each other:

$$|B_1|=|B_2|, |B_3|=|B_4| \text{ and } |B_1|\neq|B_3|.$$

By using such a relation between the strengths between the four magnetic delta barriers induced by a single magnetic double pair element inducing of a perpendicular magnetic field induced into the channel region is of the net zero A-type is secured, whereby it is secured that a net polarization of the electrons passing through the channel is generated by each magnetic double pair element. $B_1$, $B_2$, $B_3$, and $B_4$ are all measured in the z-direction, i.e. the direction perpendicular to the channel region.

In another alternative embodiment the strength of the magnetic field induced by the first magnetic delta barrier is $B_1$, the strength of the magnetic field induced by the second magnetic delta barrier is $B_2$, the strength of the magnetic field induced by the third magnetic delta barrier is $B_3$, and the strength of the magnetic field induced by the forth magnetic delta barrier is $B_4$, wherein $B_1$, $B_2$, $B_3$, and $B_4$ have the following relation to each other:

$$|B_1|=|B_2|=|B_3|=|B_4|.$$

Preferably, the gate comprises a patterned layer, i.e. the gate is made of a patterned media. This patterned media comprises patterned elements which can be made with a high aspect ratio, e.g. with a small length in x-direction compared to the length in z-direction thus leading to the fact that the magnetization will prefer to align in the vertical direction.

In another embodiment the induced magnetic field is parallel to an interface surface between the gate and the channel region and perpendicular to a line leading from source to drain.

A magneto-electric field effect transistor according to the present invention can be implemented in an amplifier or a memory chip.

An amplifier comprising a magneto-electric field effect transistor according to the present invention is sensitive to small voltage changes and exhibit linear change of spin polarization with the gate voltage. The polarization can be converted to voltage. Further, the linear increase occurs about Fermi energy.

Summarizing, an aspect of the inventive idea can be seen in using a gate comprising at least one magnetic double pair element to induce magnetic delta barriers into a, preferably HEMT like, channel region of a magneto-electric barrier field-effect transistor. Preferably, the magnetic double pair element induces a perpendicular magnetic field of net zero A-type into the channel region of the magneto-electric barrier field-effect transistor, wherein the perpendicular magnetic field is preferably induced by magnets the poles of which are aligned substantially perpendicular to the plane of the channel region so that a magnet field $B_z$ perpendicular to the plane of the channel region is induced into the channel region. Furthermore, an electric potential is applied to the gate of the magneto-electric barrier field-effect transistor. The described structure of the magneto-electric barrier field-effect transistor secures that the polarization of polarized electrons which are injected into the channel region is increased. Even for permanent B-fields induced by permanent magnets, a degree of flexibility in control of the spin polarization exists, since the multiple magnetic delta barriers, which can be seen as a kind of different gates of the magneto-electric barrier field-effect transistor, can be initialized with different magnetization configurations.

Between one magnetic double pair element and a next magnetic double pair element preferably a non-magnetic magnetic region is arranged. The function of the non-magnetic metallic region is to provide a contact for the application of gate voltage and act as a spacer to separate the magnetic double pair elements from each other. The magnetic regions should be separated from each other so that the perpendicular field can approach the ideal profile of two well separated square barriers. Alternatively, no non-magnetic region is arranged between one magnetic double pair element and a next magnetic double pair element and the gate voltage is applied to the magnetic materials of the magnetic double pair element. A soft magnetic underlayer is used to strengthen the magnetic field $B_z$ and to enhance the orientation of the magnetic field $B_z$, i.e. the soft magnetic underlayer ensures that the B-field lines from the magnetic portions of the gate keep a perpendicular course as they cut through the 2DEG.

The requirement of wavefunction amplitude and flux continuity across the magnetic delta barriers cause different transmission probability for spin-up and spin-down electrons, thus resulting in a net spin polarization of carriers, e.g. electrons, within the 2DEG. The present invention provides a spin-FET in which the spin polarization can be increased with a lower gate voltage than in traditional spin-FET. Preferably the source injects electrons polarized in the x-direction, i.e. into the direction of the channel region, while the drain is adapted to detect electrons which are polarized in the z-direction, i.e. the direction of the induced magnetic field. The magnets of each magnetic double pair element can be embodied by permanent magnets, single pole writing heads, electromagnet and/or a combination thereof.

The invention is explained in more detail in the following with reference to the non-limiting embodiments and figures in which.

Figure 9:
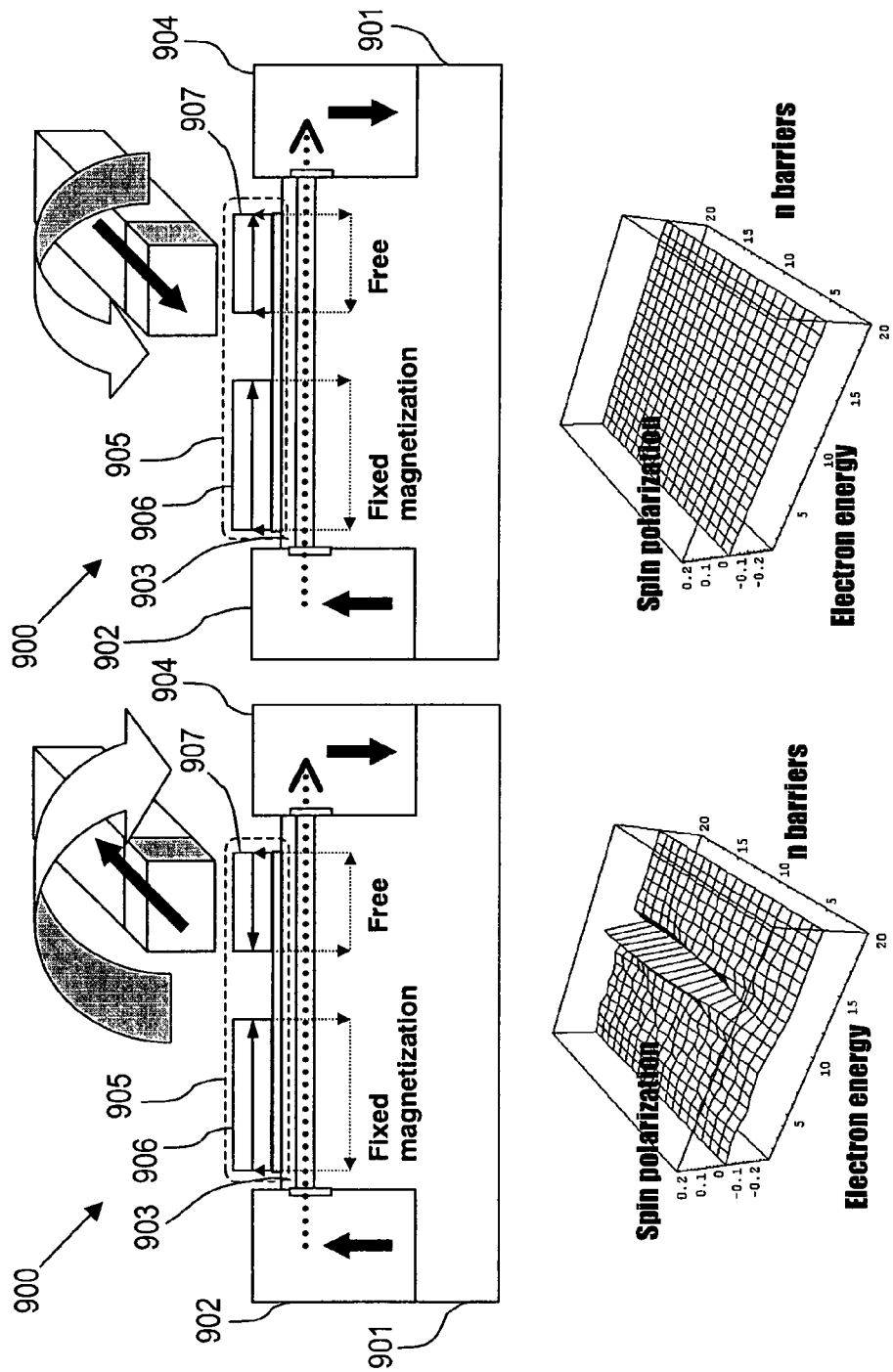
Figure 10B:
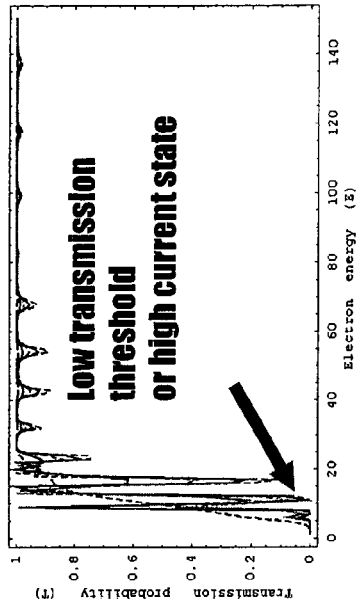
Figure 10D:
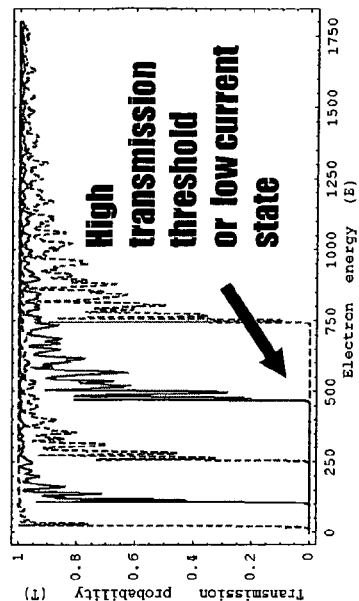
Figure 10A:
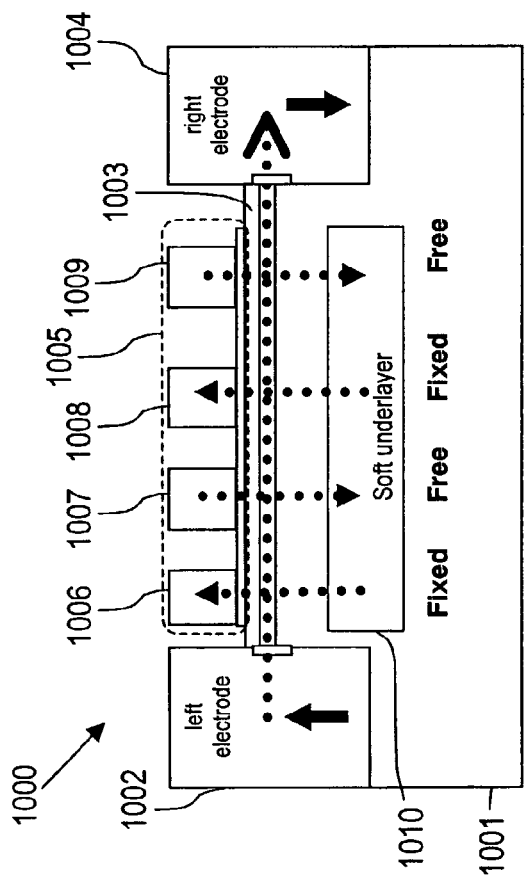
Figure 10C:
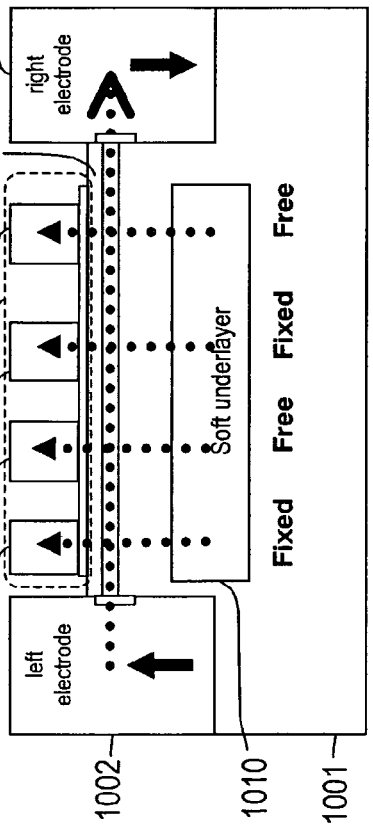
Figure 11:
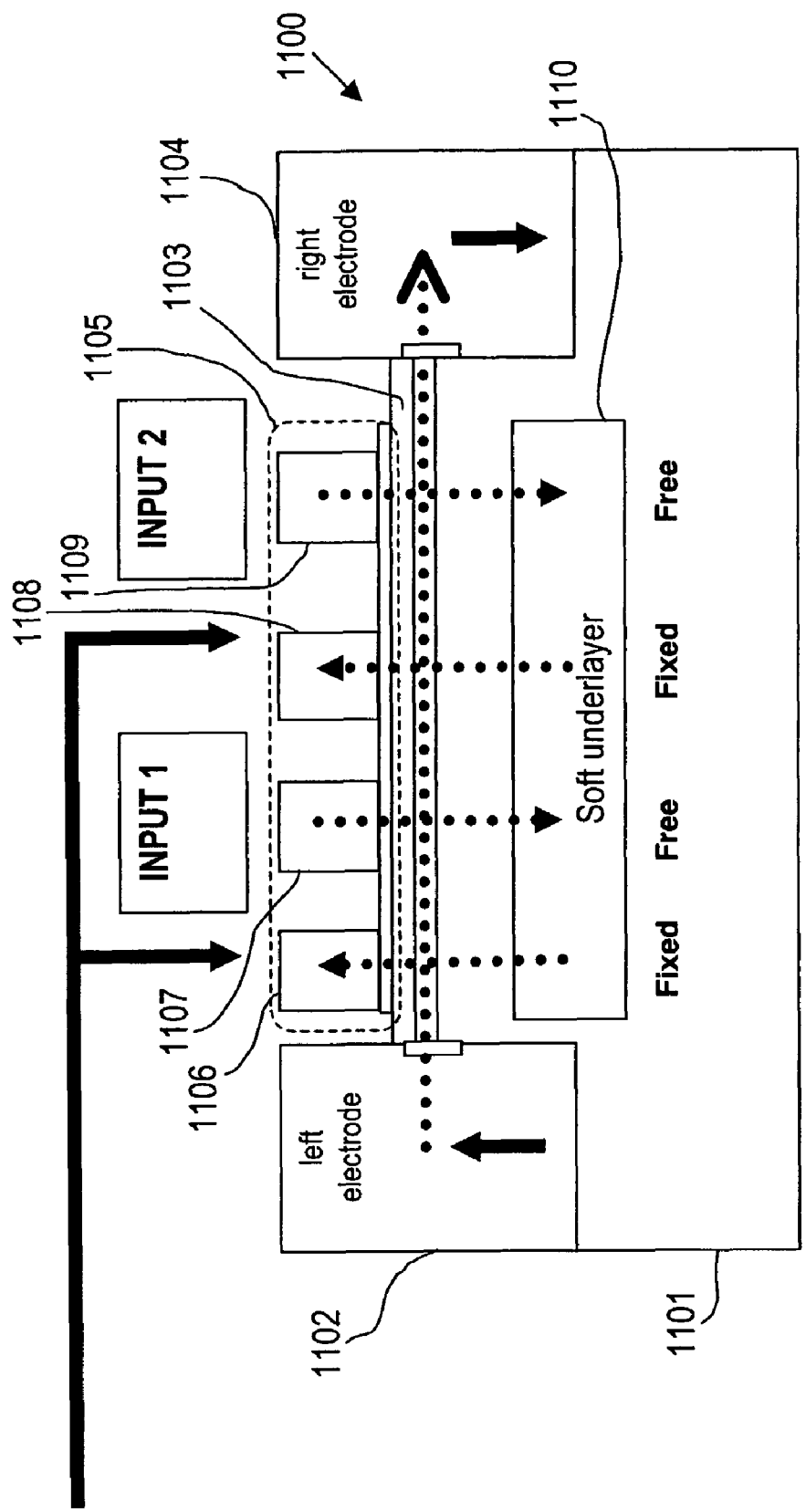

FIG. 9 shows a schematic illustration of a non-volatile memory cell within a magneto-electric barrier field effect transistor according to an embodiment of the present invention, FIG. 10 shows a schematic illustration of a non-volatile memory cell within a magneto-electric barrier field effect transistor according to another embodiment of the present invention, and FIG. 11 shows a schematic illustration of a programmable AND/NAND gate according to an embodiment of the present invention.

Figure 1:
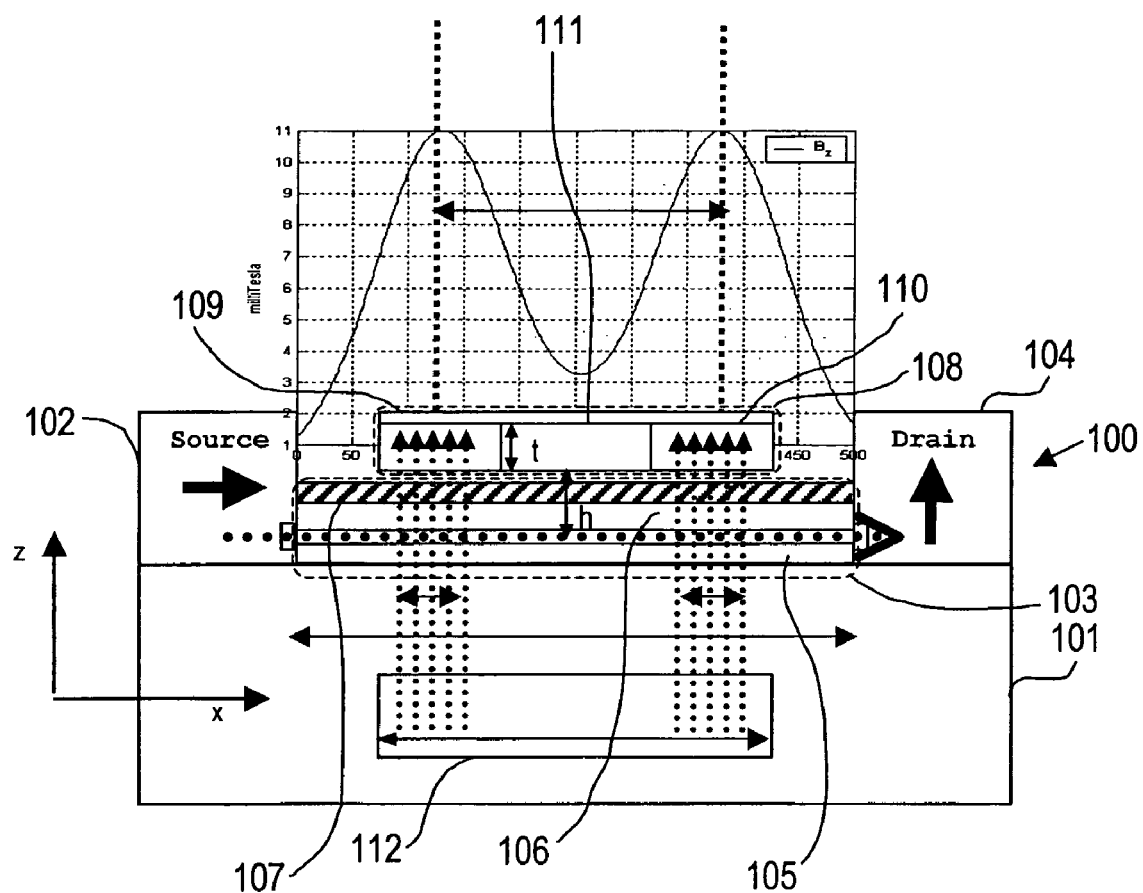
FIG. 1 shows a schematic general layout of a magneto-electric barrier field-effect transistor (spin-FET) according to an embodiment of the present invention.

FIG. 1 schematically shows a general layout of a magneto-electric barrier field-effect transistor 100 (spin-FET) according to the present invention. The spin-FET 100 comprises a substrate 101 consisting of Galliumarsenid (GaAs) or another suitable semiconductor material such as silicon. A source 102, a High Electron Mobility Transistor like multilayer (HEMT) 103, which forms a HEMT like channel region, and a drain 104 are arranged on the substrate 101.

The source 102 is adapted to inject spin polarized carriers, i.e. electrons, into the HEMT like channel region 103. The source is made of a non-magnetic material, a ferromagnetic material, a half metal, or a magnetic semiconductor and is magnetized in the x-direction, which is the direction which leads from the source 102 to a drain 104 of the spin-FET. The drain is made of a ferromagnetic material, a half metal, or a magnetic semiconductor or combinations thereof. Further, the drain is adapted to detect spin polarized electrons, in particular the drain is adapted to detect electrons polarized in the z-direction, i.e. the direction which is perpendicular to the plane in which the two dimensional space of a two-dimensional electron gas (2DEG) is arranged.

The HEMT like channel region 103, which produces the 2DEG, comprises three sublayers. A first sublayer 105, the sublayer which is arranged on the substrate 101, consists of Galliumarsenid (GaAs) and acts as a buffer layer. A second sublayer 106, the sublayer which is arranged on the first sublayer 106, consists of Aluminum-Gallium-Arsenic (AlGaAs), and acts as a spacer layer. The third sublayer 107, which consists of n$^+$ doped Aluminum-Gallium-Arsenic (n$^+$AlGaAs), is arranged on top of the second sublayer 106. The third sublayer 107 acts as a donor layer. In case of a HEMT like channel region no gate insulating layer is needed, since the presence of band-bending at the AlGaAs—GaAs causes an electrostatic barrier which prevents current from flowing in the transverse direction, i.e. perpendicular to the HEMT like channel region.

Figure 2:
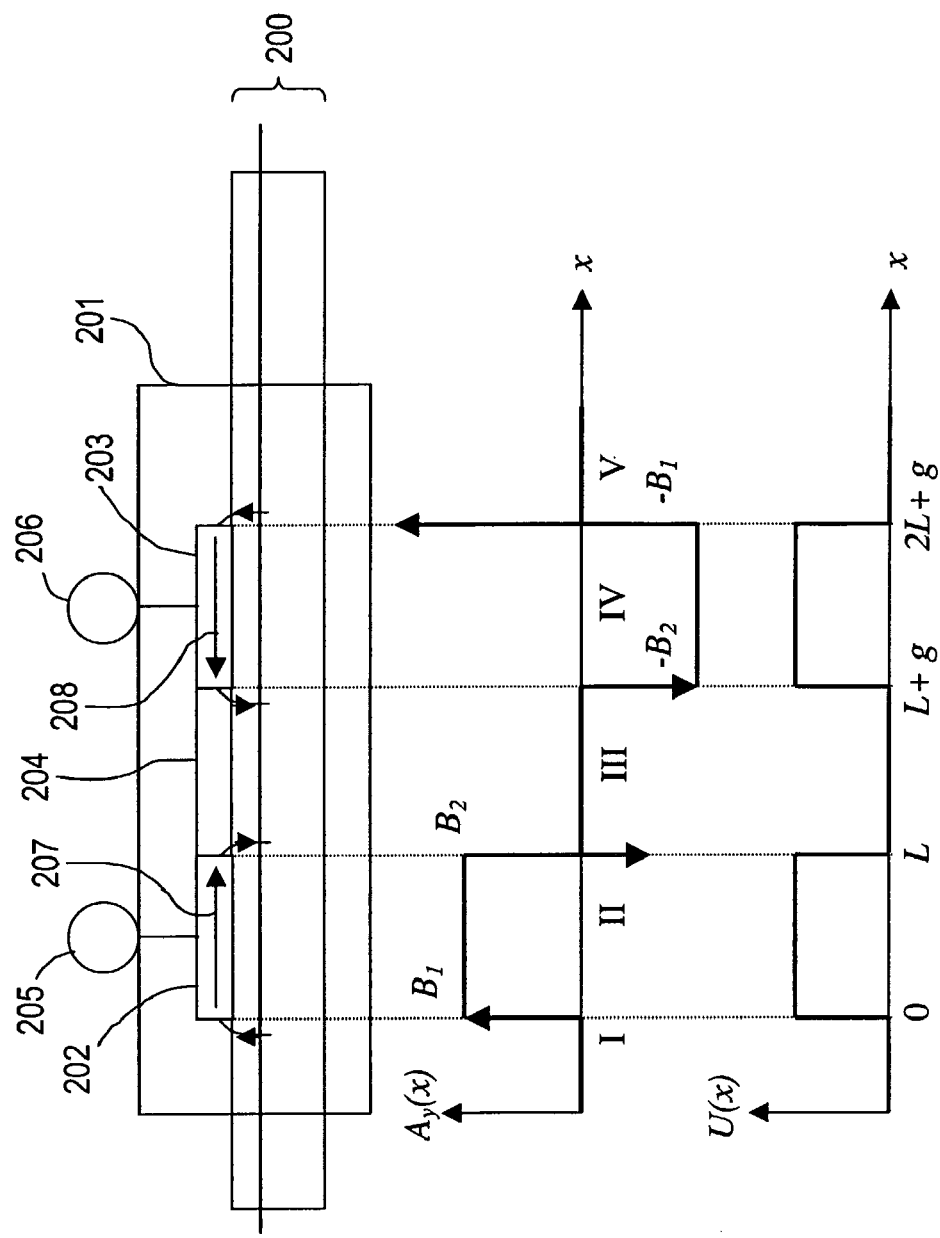
FIG. 2 shows a detailed depiction of a magnetic double pair element according to another embodiment of the present invention.

Further, the spin-FET comprises a gate 108 comprising magnetic double pair elements which gate is arranged on top of the third sublayer 107. In a preferred embodiment the number of magnetic double pair elements is ten. For the sake of clarity in FIG. 1 only two magnetic double pair elements 109 and 110 are shown. Each magnetic double pair element is embodied by two permanent magnets of Cobalt-Chromium-Platinum and/or Iron-Platinum. Other suitable materials including Iron-Cobalt and/or Cobalt-Palladium. Each permanent magnet is magnetized such that the magnetization of the permanent magnet is substantially perpendicular to the x-direction and thus introduce a magnetic field in the z-direction ($B_z$) of the spin-FET, i.e. a magnetic field which is perpendicular to the 2DEG. In another embodiment the magnetization of the permanent magnet is substantially parallel to the x-direction and thus introduce a fringe magnetic field in the z-direction ($B_z$) of the spin-FET, i.e. a magnetic field which is perpendicular to the 2DEG. A more detailed view of the magnetic double pair elements according to the embodiment having substantially parallel magnetized permanent magnets is shown in FIG. 2. As shown in FIG. 1, preferably between one magnetic double pair element and the next magnetic double pair element a non-magnetic metallic element 111 is arranged. The function of the non-magnetic metallic element is to provide a contact for the application of a gate voltage and to act as a spacer to separate the magnetic regions from each other. The magnetic regions should be separated from each other so that the perpendicular field can approach the ideal profile of two well separated square barriers.

Furthermore, the spin-FET 100 comprises a soft magnetic underlayer 112. The soft magnetic underlayer 112 is buried in the substrate 101 and is arranged opposite to the gate 108. The soft magnetic underlayer is used to strengthen the magnetic field $B_z$ and to enhance the orientation of the magnetic field $B_z$, i.e. the soft magnetic underlayer ensures that the B-field lines from the magnetic portions of the gate keep a perpendicular course as they cut through the 2DEG. Materials that are suitable for the soft magnetic underlayer include, but are not limited to, Iron-Cobalt-Boron, Cobalt-Zirconium-Niobium, Iron-Aluminum-Nitrogen, or Nickel-Iron like Permalloy ($Ni_{0.8}Fe_{0.2}$) or $Ni_{0.45}Fe_{0.55}$. The use of the soft magnetic underlayer is in particular advantageous in the embodiment in which the magnetization of the permanent magnet is substantially perpendicular to the x-direction and thus introduce a magnetic field in the z-direction ($B_z$) of the spin-FET, i.e. a magnetic field which is perpendicular to the 2DEG. Further it is to be noted that the Dresselhaus & Rashba spin coupling in the 2DEG is detectable only for spin in x-y plane and in z-direction in the form of oscillations as the spin precesses around the in-plane axis.

For illustrative purposes the magnetic field $B_z$ induced by the magnetic double pair elements is shown in FIG. 1 as well as some exemplary dimensions of the spin-FET schematically depicted in FIG. 1. Some more dimensions depicted in FIG. 1 are:

t=200 nm, wherein t is the thickness of the magnetic double pair elements, which are formed as magnetic films;

h=60 nm, wherein h is the distance of the 2DEG from the magnetic film, i.e. the bottom of the gate;

$D_{sd}$=500 nm, wherein $D_{sd}$ is the distance between source and drain; and w=150 nm, wherein w is the width of each magnetic strip, i.e. each magnetic double pair element.

Figure 5:
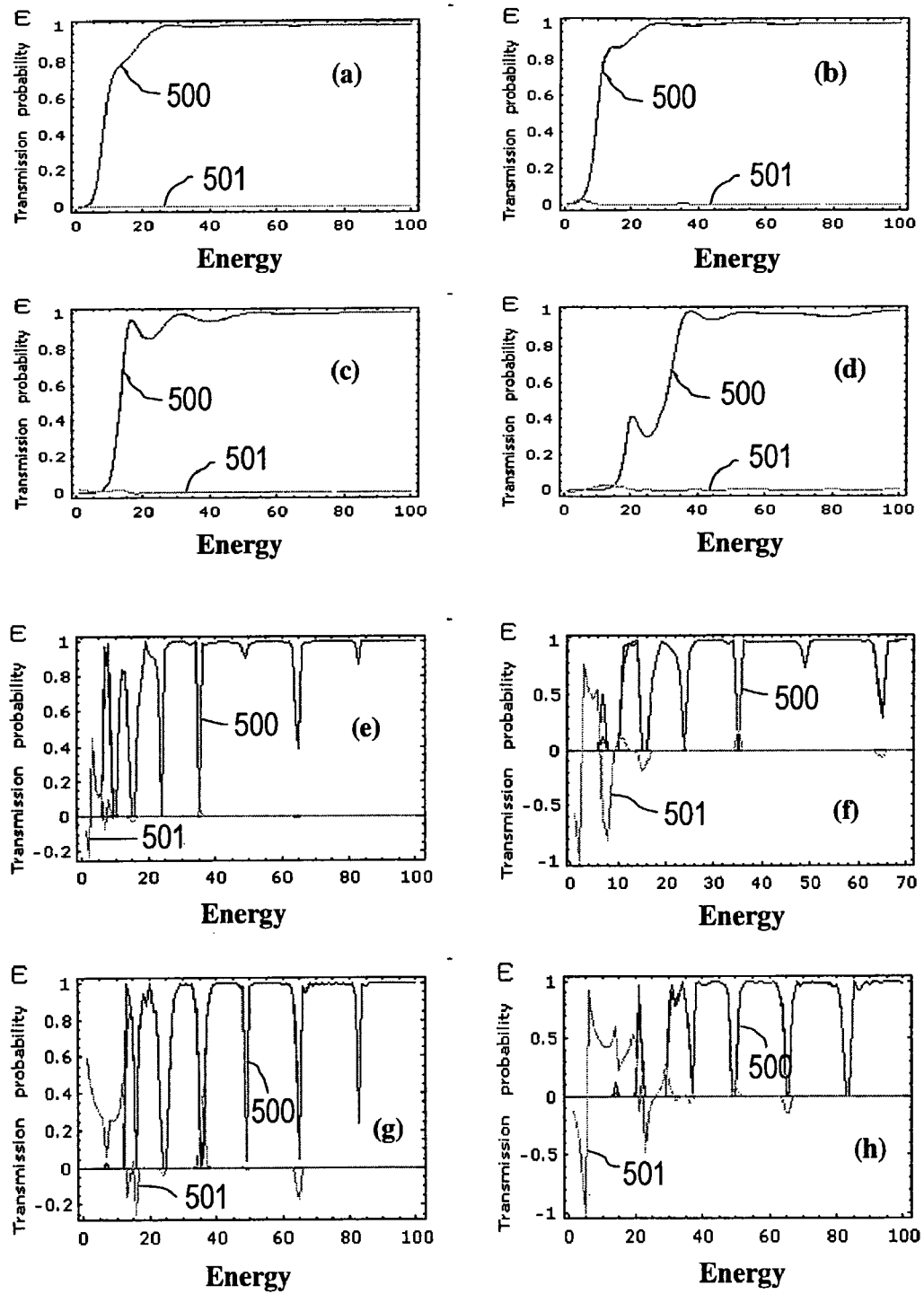
FIG. 5 shows results of simulations for different configurations of a gate of the magneto-electric barrier field-effect transistor according to an embodiment of the present invention.

The total thickness of the three sublayers ranges from 50 nm to 100 nm. Preferably, the first sublayer 105 has a thickness of 30 nm, the second sublayer 106 has a thickness of 5 nm and the third sublayer has a thickness of 20 nm. The soft magnetic underlayer has a length of approximately 440 nm, which corresponds to a magnetic field $B_0$ of approximately 10 mT. Furthermore, a saturation magnetization of 800 cm$^{-3}$ is chosen for the magnetic double pair elements for simulations whose results are depicted in FIG. 5.

Another possible structure for a multilayer structure for a magneto-electric field effect transistor is an n$^+$doped Indium-Gallium-Arsenic cap layer of a thickness of 40 nm, an n$^+$doped Indium-Aluminum-Arsenic carrier supply layer of a thickness of 30 nm, an undoped Indium-Aluminum-Arsenic spacer layer of a thickness of 3.5 nm, an undoped Indium-Gallium-Arsenic channel layer of a thickness of 2.5 nm, an undoped Indium-Arsenic inserted layer of a thickness of 4 nm and an undoped Indium-Gallium-Arsenic buffer layer of a thickness of about 500 nm on an Indium-Phosphorus substrate. A suitable doping is in the range of 4·10$^{18}$/cm$^3$ for the carrier supply layer and the cap layer, wherein silicon is used for doping. A suitable growth temperature of the multilayer structure is about 300° C.

A possible inverted structure for a multilayer structure for a magneto-electric field effect transistor is an n$^+$doped Indium-Gallium-Arsenic cap layer of a thickness of 10 nm, an undoped Indium-Aluminum-Arsenic gate Schottky layer of a thickness of 20 nm, an undoped Indium-Gallium-Arsenic channel layer of a thickness of 13.5 nm, an undoped Indium-Arsenic inserted layer of a thickness of 4 nm, an undoped Indium-Gallium-Arsenic channel layer of a thickness of 2.5 nm, an undoped Indium-Aluminum-Arsenic spacer layer of a thickness of about 6 nm, an n$^+$doped Indium-Aluminum-Arsenic carrier supply layer of a thickness of 7 nm and an undoped Indium-Aluminum-Arsenic buffer layer of a thickness of about 200 nm on an Indium-Phosphorus substrate. A suitable doping is in the range of 4·10$^{18}$/cm$^3$ for the carrier supply layer and the cap layer, wherein silicon is used for doping. A suitable growth temperature of the multilayer structure is about 300° C.

All the dimensions and numbers given above are for illustrative purpose only and are not to be understood to be limiting. Typical values for parameters in a magneto-electric field effect transistor according to the present invention are about for the carrier mobility: 1.5·10$^4$ cm$^2$/Vs at 300K and 1.11·10$^5$ cm$^2$/Vs at 10K, for carrier concentration: 2.3·10$^{12}$ cm$^2$ at 300K and at 10K, for the Landé factor |g|: 3.8, for a gatelength of 0.5 μm at 300K a threshold voltage of −1 V, and for maximum extrinsic transconductance at 300K: 700 mS/mm Furthermore, FIG. 1 shows the simulated magnetic field ($B_z$) profile along the x-axis of the exemplary device. The B field peaks at approximately 11 mT and the separation between the two peaks is 240 nm. However, theoretical computation is performed for B field of 10 mT and a separation of 350 nm. The gatelength, which is equal to the distance from source to drain, of 500 nm can be fabricated with today's lithography equipment.

FIG. 2 shows a detailed depiction of a magnetic double pair element according to an embodiment of the present invention. In FIG. 2 a schematic HEMT like channel region 200 is shown. The HEMT like channel region generates the 2DEG. On top of the HEMT like channel region 200 one magnetic double pair element 201 is shown. The magnetic double pair element 201 comprises a first ferromagnetic region 202, e.g. a first permanent magnet, and a second ferromagnetic region 203, e.g. a second permanent magnet. Between the first ferromagnetic region 202 and the second ferromagnetic region 203 preferably a non magnetic metallic region 204 is arranged. Furthermore, each of the two ferromagnetic regions is connected to a voltage source, depicted schematically as a first voltage source 205 and a second voltage source 206. In FIG. 2 the x-axis leads from left to right.

The magnetization direction of the first magnetic region 202 is depicted schematically with an arrow 207 and is parallel to the x-axis, while the magnetization direction of the second magnetic region 203 is depicted schematically with an arrow 208 and is antiparallel to the x-axis. Furthermore, the fringe fields of the magnetic regions are depicted, which fringe fields inducing a perpendicular magnetic field into the 2DEG. By arranging the ferromagnetic regions as depicted in FIG. 2 it is automatically secured that a net zero A-type configuration of the magnetic double pair element is achieved.

In FIG. 2 also the strength of the magnetic vector potential A is schematically shown. In a first domain I the magnetic vector potential A is zero. In a second domain II the magnetic vector potential A has a value higher than zero. The value of the magnetic vector potential A increases at a first magnetic delta barrier which is embodied by the left edge of the first ferromagnetic region 202. In a third domain III the magnetic vector potential A is zero. The value of the magnetic vector potential A decreases at a second magnetic delta barrier which is embodied by the right edge of the first ferromagnetic region 202. In a fourth domain IV the magnetic vector potential A has a value lower than zero. The value of the magnetic vector potential A decreases at a third magnetic delta barrier which is embodied by the left edge of the second ferromagnetic region 203. In a fifth domain V the magnetic vector potential A is zero. The value of the magnetic vector potential A increases at a fourth magnetic delta barrier which is embodied by the right edge of the second ferromagnetic region 203.

Further, the value of an electric potential U is depicted in FIG. 2. The electric potential U is induced by the voltage sources 205 and 206. In the first domain I the electric potential U is zero. In the second domain II the electric potential U has a value higher than zero, wherein higher than zero means that the electric potential U is non-zero, i.e. has a positive value or a negative value which is not zero. The value of the electric potential U increases at the first magnetic delta barrier which is embodied by the left edge of the first ferromagnetic region 202. In the third domain III the electric potential U is zero. The value of the electric potential U decreases at the second magnetic delta barrier which is embodied by the right edge of the first ferromagnetic region 202. In the fourth domain IV the electric potential U has a value higher than zero. The value of the electric potential U increases at the third magnetic delta barrier which is embodied by the left edge of the second ferromagnetic region 203. In the fifth domain V the electric potential U is zero. The value of the electric potential U decreases at the fourth magnetic delta barrier which is embodied by the right edge of the second ferromagnetic region 203.

The second domain II and the fourth domain IV have a length L in the x-direction, while the third domain III has a length g in the x-direction.

Figure 3:
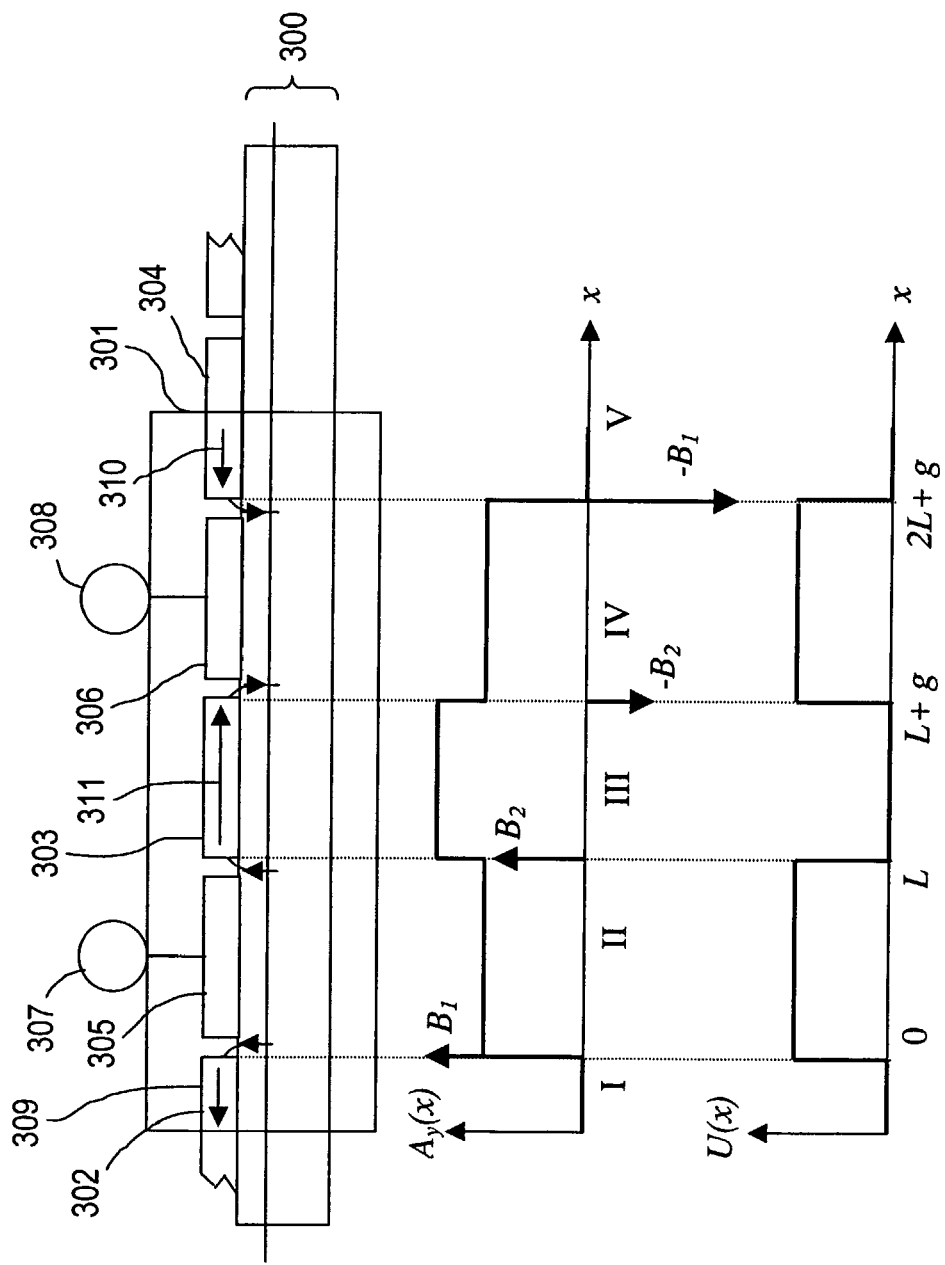
FIG. 3 shows a detailed depiction of a magnetic double pair element according to a further embodiment of the present invention.

FIG. 3 shows a detailed depiction of a magnetic double pair element according to another embodiment of the present invention. In FIG. 3 a schematic HEMT like channel region 300 is shown. The HEMT like channel region generates the 2DEG. On top of the HEMT like channel region 300 one magnetic double pair element 301 is shown. The magnetic double pair element 301 comprises a first ferromagnetic region 302, e.g. a part of a first permanent magnet, a second ferromagnetic region 303, e.g. a second permanent magnet, and a third ferromagnetic region 304, e.g. a part of a third permanent magnet. Preferably, between the first ferromagnetic region 302 and the second ferromagnetic region 303 a first non-magnetic metallic region 305 is arranged and between the second ferromagnetic region 303 and the third ferromagnetic region 304 a second non-magnetic metallic region 306 is arranged. Furthermore, each of the two non-magnetic regions is connected to a voltage source, depicted schematically as a first voltage source 307 and a second voltage source 308. In FIG. 3 the x-axis leads from left to right.

The magnetization directions of the first ferromagnetic region 302 and the third ferromagnetic region 304 are depicted schematically with arrow 309 and arrow 310, respectively and are antiparallel to the x-axis, while the magnetization direction of the second magnetic region 303 is depicted schematically with an arrow 311 and is parallel to the x-axis. Furthermore, the fringe fields of the magnetic regions are depicted, which fringe fields inducing a perpendicular magnetic field into the 2DEG. When arranging the ferromagnetic regions as depicted in FIG. 3 it has to be secured that absolute values of the magnetic fields induced by the first ferromagnetic region 302 and the third ferromagnetic region 304 are the same to achieve a net zero A-type configuration of the magnetic double pair element. Alternatively, the magnetic double pair element can be formed by magnets the poles of which are aligned substantially perpendicular to the channel region and thus inducing more directly a perpendicular magnetic field into the 2DEG.

Further, in FIG. 3 also the strength of the magnetic vector potential A is schematically shown. In a first domain I the magnetic vector potential A is zero. In a second domain II the magnetic vector potential A has a value higher than zero. The value of the magnetic vector potential A increases at a first magnetic delta barrier which is embodied by the right edge of the first ferromagnetic region 302. In a third domain III the magnetic vector potential A is increased to a value higher than the value in the second domain II. The value of the magnetic vector potential A increases at a second magnetic delta barrier which is embodied by the left edge of the second ferromagnetic region 302. In a fourth domain IV the magnetic vector potential A has the same value as in the second domain II. The value of the magnetic vector potential A decreases at a third magnetic delta barrier which is embodied by the right edge of the second ferromagnetic region 303. In a fifth domain V the magnetic vector potential A is zero. The value of the magnetic vector potential A decreases at a fourth magnetic delta barrier which is embodied by the left edge of the third ferromagnetic region 304.

Further, the value of an electric potential U is depicted in FIG. 3. The electric potential U is induced by the voltage sources 307 and 308. In the first domain I the electric potential U is zero. In the second domain II the electric potential U has a value higher or lower than zero. The value of the electric potential U increases at the first magnetic delta barrier which is embodied by the left edge of the first non-magnetic region 305. In the third domain III the electric potential U is zero. The value of the electric potential U decreases at the second magnetic delta barrier which is embodied by the right edge of the first non-magnetic region 305. In the fourth domain IV the electric potential U has a value higher or lower than zero. The value of the electric potential U increases at the third magnetic delta barrier which is embodied by the left edge of the second non-magnetic region 306. In the fifth domain V the electric potential U is zero. The value of the electric potential U decreases at the fourth magnetic delta barrier which is embodied by the right edge of the second non-magnetic region 306.

The second domain II and the fourth domain IV have a length L in the x-direction, while the third domain III has a length g in the x-direction.

Figure 4:
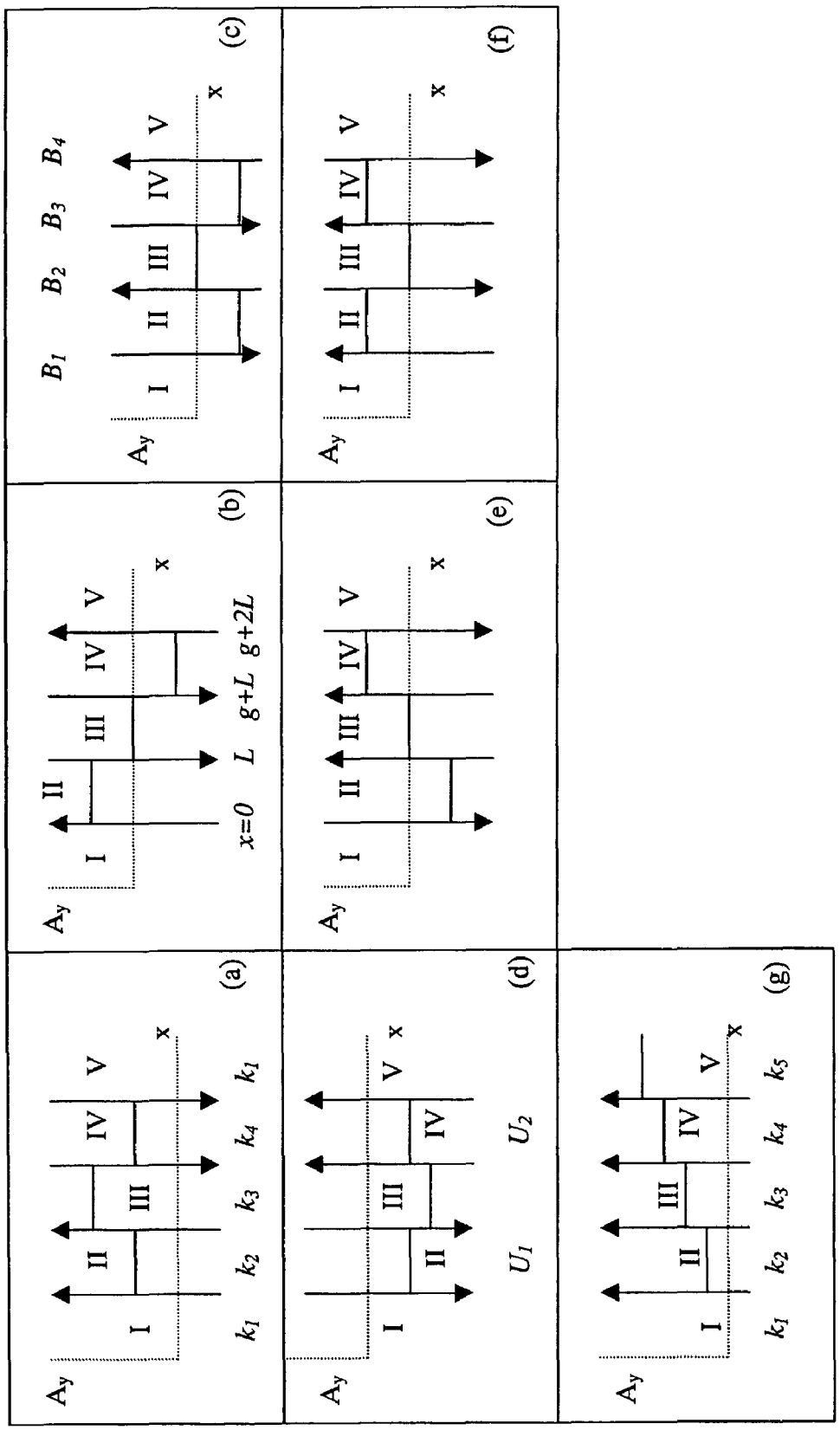
FIG. 4 shows schematics of net zero A-type configurations.

In FIG. 4 some configurations of magnetic delta barriers are schematically shown. In FIG. 4a to FIG. 4f the strength of the magnetic vector potentials A is schematically shown for different net zero A-type configurations. All of these configurations can be used in a spin-FET according to the present invention. In FIG. 4a, in a first domain I the magnetic vector potential A is zero. In a second domain II the magnetic vector potential A has a value higher than zero. The value of the magnetic vector potential A increases at a first magnetic delta barrier. In a third domain III the magnetic vector potential A is increased to a value higher than the value in the second domain II. The value of the magnetic vector potential A increases at a second magnetic delta barrier. In a fourth domain IV the magnetic vector potential A has the same value as in the second domain II. The value of the magnetic vector potential A decreases at a third magnetic delta barrier. In a fifth domain V the magnetic vector potential A is zero. The value of the magnetic vector potential A decreases at a fourth magnetic delta barrier. The shown net zero A-type configuration is the same as the configuration depicted in FIG. 3.

In FIG. 4b, in a first domain I the magnetic vector potential A is zero. In a second domain II the magnetic vector potential A has a value higher than zero. The value of the magnetic vector potential A increases at a first magnetic delta barrier. In a third domain III the magnetic vector potential A is decreased to zero. The value of the magnetic vector potential A decreases at a second magnetic delta barrier. In a fourth domain IV the magnetic vector potential A has a value lower than zero. The value of the magnetic vector potential A decreases at a third magnetic delta barrier. In a fifth domain V the magnetic vector potential A is zero. The value of the magnetic vector potential A increases at a fourth magnetic delta barrier. The shown net zero A-type configuration is the same as the configuration depicted in FIG. 2.

In FIG. 4c, in a first domain I the magnetic vector potential A is zero. In a second domain II the magnetic vector potential A has a value lower than zero. The value of the magnetic vector potential A decreases at a first magnetic delta barrier. In a third domain III the magnetic vector potential A is increased to zero. The value of the magnetic vector potential A increases at a second magnetic delta barrier. In a fourth domain IV the magnetic vector potential A has a value lower than zero. The value of the magnetic vector potential A decreases at a third magnetic delta barrier. In a fifth domain V the magnetic vector potential A is zero. The value of the magnetic vector potential A increases at a fourth magnetic delta barrier. The shown net zero A-type configuration is similar as the configuration depicted in FIG. 2. The configuration described in FIG. 4c would be achieved by a configuration shown in FIG. 2 when the arrow 207 showing the magnetization direction of the ferromagnetic region 202 is inverted.

In FIG. 4d, in a first domain I the magnetic vector potential A is zero. In a second domain II the magnetic vector potential A has a value lower than zero. The value of the magnetic vector potential A decreases at a first magnetic delta barrier. In a third domain III the magnetic vector potential A is decreased to a value lower than the value in the second domain II. The value of the magnetic vector potential A decreases at a second magnetic delta barrier. In a fourth domain IV the magnetic vector potential A has the same value as in the second domain II. The value of the magnetic vector potential A increases at a third magnetic delta barrier. In a fifth domain V the magnetic vector potential A is zero. The value of the magnetic vector potential A increases at a fourth magnetic delta barrier. The shown net zero A-type configuration is similar as the configuration depicted in FIG. 3. The configuration described in FIG. 4d would be achieved by a configuration shown in FIG. 3 when inverting the arrows 309, 310 and 311 showing the magnetization direction of the ferromagnetic regions 302, 303 and 304.

In FIG. 4e, in a first domain I the magnetic vector potential A is zero. In a second domain II the magnetic vector potential A has a value lower than zero. The value of the magnetic vector potential A decreases at a first magnetic delta barrier. In a third domain III the magnetic vector potential A is increased to zero. The value of the magnetic vector potential A increases at a second magnetic delta barrier. In a fourth domain IV the magnetic vector potential A has a value higher than zero. The value of the magnetic vector potential A increases at a third magnetic delta barrier. In a fifth domain V the magnetic vector potential A is zero. The value of the magnetic vector potential A decreases at a fourth magnetic delta barrier. The shown net zero A-type configuration is similar as the configuration depicted in FIG. 2. The configuration described in FIG. 4e would be achieved by a configuration shown in FIG. 2 when inverting the arrows 207 and 208 showing the magnetization direction of the ferromagnetic regions 202 and 203.

In FIG. 4f in a first domain I the magnetic vector potential A is zero. In a second domain II the magnetic vector potential A has a value higher than zero. The value of the magnetic vector potential A increases at a first magnetic delta barrier. In a third domain III the magnetic vector potential A is decreased to zero. The value of the magnetic vector potential A decreases at a second magnetic delta barrier. In a fourth domain IV the magnetic vector potential A has a value higher than zero. The value of the magnetic vector potential A increases at a third magnetic delta barrier. In a fifth domain V the magnetic vector potential A is zero. The value of the magnetic vector potential A decreases at a fourth magnetic delta barrier. The shown net zero A-type configuration is similar as the configuration depicted in FIG. 2. The configuration described in FIG. 4f would be achieved by a configuration shown in FIG. 2 when inverting the arrow 208 showing the magnetization direction of the ferromagnetic region 203.

As an example in FIG. 4g a magnetic vector potential A of a configuration is shown which does not have a net zero A-type. Therefore, the configuration shown in FIG. 4g is less suitable in a spin-FET according to the present invention, since using of multiple magnetic double pair elements according the example shown in FIG. 4g would lead to a low transmission probability. In FIG. 4g in a first domain J the magnetic vector potential A is zero. In a second domain II the magnetic vector potential A has a value higher than zero. The value of the magnetic vector potential A increases at a first magnetic delta barrier. In a third domain III the magnetic vector potential A is increased to a value higher than the value in the second domain II. The value of the magnetic vector potential A increases at a second magnetic delta barrier. In a fourth domain IV the magnetic vector potential A has a value higher than the value in the third domain III. The value of the magnetic vector potential A increases at a third magnetic delta barrier. In a fifth domain V the magnetic vector potential A is higher than the value in the fourth domain IV. The value of the magnetic vector potential A increases at a fourth magnetic delta barrier. Such an configuration leads to a decreased transmission probability since with every magnetic delta barrier crossed the magnetic vector potential A is increased leading to a deflection of the electrons passing through a channel of a spin-FET such that the kinetic energy of the electrons in x-direction is decreased.

All magnetic profiles shown in FIG. 4a to FIG. 4g can be used to generate a net spin polarization of electrons traveling through the channel region of a spin-FET according to the present invention. Some of the shown configurations require the application of an electric potential, in particular applying of a voltage +U and −U in domains II and IV, respectively. These configurations are shown in FIG. 4a, 4c, 4d and 4f. Whereas the configurations shown in FIGS. 4b and 4e give spin polarization even without the application of voltage in domain II and IV.

FIG. 5 shows results of simulation for different configurations of a gate of the magneto-electric barrier field-effect transistor according to the invention. In each figure, i.e. FIG. 5a to FIG. 5h, the calculated transmission probability for electrons passing through the HEMT like channel region of a spin-FET according to the present invention is shown as line 500. Further, the polarization of the electrons passing through the HEMT like channel region is shown as line 501. On the x-axis of the FIG. 5a to FIG. 5h the electron energy is shown in arbitrary units. On the y-axis the transmission probability and the polarization of the electrons are shown. For all calculations the results of which are shown in FIG. 5a to FIG. 5h the strengths of the magnetic delta barriers were $B_1=B_2=+2$ in arbitrary units, and $B_3=B_4=-2$ in arbitrary units.

FIG. 5a to FIG. 5d showing the results for simulations of a spin-FET comprising a gate having one magnetic double pair element. FIG. 5a shows the transmission probability and the polarization for a gate voltage of 0.17 mV. FIG. 5b shows the transmission probability and the polarization for a gate voltage of 1.1 mV. FIG. 5c shows the transmission probability and the polarization for a gate voltage of 3.0 mV. FIG. 5d shows the transmission probability and the polarization for a gate voltage of 6.8 mV. The figures show that the polarization of the electrons passing through the HEMT like channel region is quite low in the case of only a single magnetic double pair element.

FIG. 5e to FIG. 5h showing the results for simulations of a spin-FET comprising a gate having 27 magnetic double pair elements, wherein the number of 27 is just an example for an arbitrary number of magnetic double pair elements. FIG. 5e shows the transmission probability and the polarization for a gate voltage of 0.17 mV. FIG. 5f shows the transmission probability and the polarization for a gate voltage of 1.1 mV. FIG. 5g shows the transmission probability and the polarization for a gate voltage of 3.0 mV. FIG. 5h shows the transmission probability and the polarization for a gate voltage of 6.8 mV. The figures show that in the case of 27 magnetic double pair elements the polarization of the electrons passing through the HEMT like channel region is significantly increased compared to the case of only a single magnetic double pair element.

Both cases, i.e. the configuration with one double pair element and with 27 double pair elements, show significant changes in the transmission probability even with low gate voltage of the order of a few mV. The transmission probability curve for n=1 shows a slight modulation with electron energy, which modulation gets enhanced in the case of n=27 to yield distinct resonant peaks at low electron energies. The resonant behavior is due to the fact that only certain values of electron wavelengths are preferentially transmitted through the barriers, and this wavelength selection becomes more specific as more barriers, i.e. double pair elements, need to be crossed by the electrons. This resonant behavior is advantageous in order to achieve high spin polarization, as the selected wavelength is slightly different for spin-up and spin-down electrons. Thus, leading to a situation whereby one spin is preferentially transmitted, while the other one is blocked, leading to a spin polarization exceeding 50%. FIG. 5 shows that it is possible to achieve a narrow peak high spin polarization at low electron energies, which ensures that high spin polarization corresponds to a region of high transmission probability as well, so that the gate can act to switch the spin-polarizing property by a small shift in value. At high electron energies the barriers posed by both the electrostatic and magnetic fields become insignificant which ensures high transmission probability. Furthermore, the difference in spin-up and spin-down energies, which is proportional to the magnetic field B, becomes insignificant, thus the spin-polarization drops.

The computation shows that spin polarization of the electrons varies with very low voltages. Increase of the magnetic field also causes significantly changes of the spin polarization. FIG. 5 shows that with increasing number of magnetic double pair elements, i.e. magnetic delta barriers, the spin polarization increases.

In the following paragraphs some theoretical derivations of the spin polarization are given. Electron motion in the 2DEG can be described by a ground state Fermi circle, with $k_x$ and $k_y$ denoting the in-plane wave-vectors. The Hamiltonian that describes the influence of U and B barriers on the electron motion is $$H = \frac{p_x^2}{2m^*} + \frac{(p_y + (e/c)A_y(x))^2}{2m^*} + U(x) + \frac{eg^*}{2m_0}\frac{\sigma\hbar}{2}B_z(x) \quad (1)$$

wherein $m^*$, $m_0$ is the electron's effective and real mass, respectively, $g^*$ is the effective Lande factor, $\sigma=+1/-1$ for spin-up/down electrons, $p_x$ and $p_y$ are electron momentum in the x- and y-directions, respectively. Considering the translational symmetry in y, the wave-function of electrons is given by $\phi(x, y) = e^{ik_y y}(Ae^{ik_x x} + Be^{-ik_x x})$. In classical motion, an electron with $+p_x$ moving through $B_z$ will experience a Lorentz force and hence deflection in −y. Therefore, an electron traveling in x-direction in a magnetic field in z-direction will gain kinetic energy in the transverse y-direction at the expense of kinetic energy in the direction of the motion. The system can be described by the Lagrangian for 1-degree of freedom $L=\frac{1}{2}m(\dot{x}^y)^2 - (e/c)\dot{x}^y A_y$, wherein $\dot{x}^y$ is velocity in y. Performing Legendre transformation of the Lagrangian, $H=\dot{x}^y p_y - L$ leads to the Hamiltonian in Eq. (1) with $p_y + eA_y$. In our work, the double-pairs of FIG. 1 are designed to cause zero net kinetic gain at the right-end of the double-pair. The total available energy, $E-U_{eff}$ is always sufficient to ensure that $k_x$ does not become evanescent. This allows to increase P by increasing the number of the zero-A double-pairs. For ease of calculation, all parameters are reduced to dimensionless units in the following manner: $x \to l_B x$, $E \to \hbar \omega_C E$, $l_B = \sqrt{\hbar/eB_0}$, $\omega_C = eB_0/m^*$. $B_0$ is some commonly achievable magnetic field.

The first quantization of the Hamiltonian results in the following equation:

$$\frac{d^2}{dx^2}(e^{ikx}) - \left[k_y + \frac{e}{\hbar}A_y\right]^2(e^{ikx}) + \frac{2m^*}{\hbar^2}\left[E - U(x) - \frac{eg^*}{2m_0}\frac{\sigma\hbar}{2}B_z(x)\right](e^{ikx}) = 0 \quad (2)$$

As an example the wave-vectors of the configurations of FIG. 4a and FIG. 4g are derived from Eq. (2).

The wave vectors of the configuration depicted in FIG. 4a are:

for domains I and V $k_1 = \sqrt{2E - k_y^2}$;

for domain II $k_2 = \sqrt{2(E+U) - (k_y + B)^2}$;

for domain III $k_3 = \sqrt{2(E) - (k_y + 2B)^2}$;

for domain IV $k_4 = \sqrt{2(E-U) - (k_y + B)^2}$.

The wave vectors of the configuration depicted in FIG. 4g are:

for domain I $k_1 = \sqrt{2E - k_y^2}$;

for domain II $k_2 = \sqrt{2(E+U) - (k_y + B)^2}$;

for domain III $k_3 = \sqrt{2(E) - (k_y + 2B)^2}$;

for domain IV $k_4 = \sqrt{2(E-U) - (k_y + 3B)^2}$;

for domain V $k_5 = \sqrt{2(E-U) - (k_y + 4B)^2}$.

The general form of the electron wave-vectors can be obtained from the above equation as below:

$$k_x = \sqrt{2(E \pm U) - (k_y + nB)^2}$$

P in terms of T is defined by Eq. (3).

$$P = \frac{T^+(E, k_y, B, U) - T^-(E, k_y, B, U)}{T^+(E, k_y, B, U) + T^-(E, k_y, B, U)} \quad (3)$$

Transmission matrices components for one double-pair magneto-electric barriers are obtained from matching wave-function amplitude and flux continuity at the magnetic delta barriers. Matching flux at the delta barriers can be performed in the following manner:

$$\frac{-\hbar^2}{2m^*}(\varphi'(\xi) - \varphi'(-\xi)) + U_0\varphi(0) = 0$$

Figure 6:
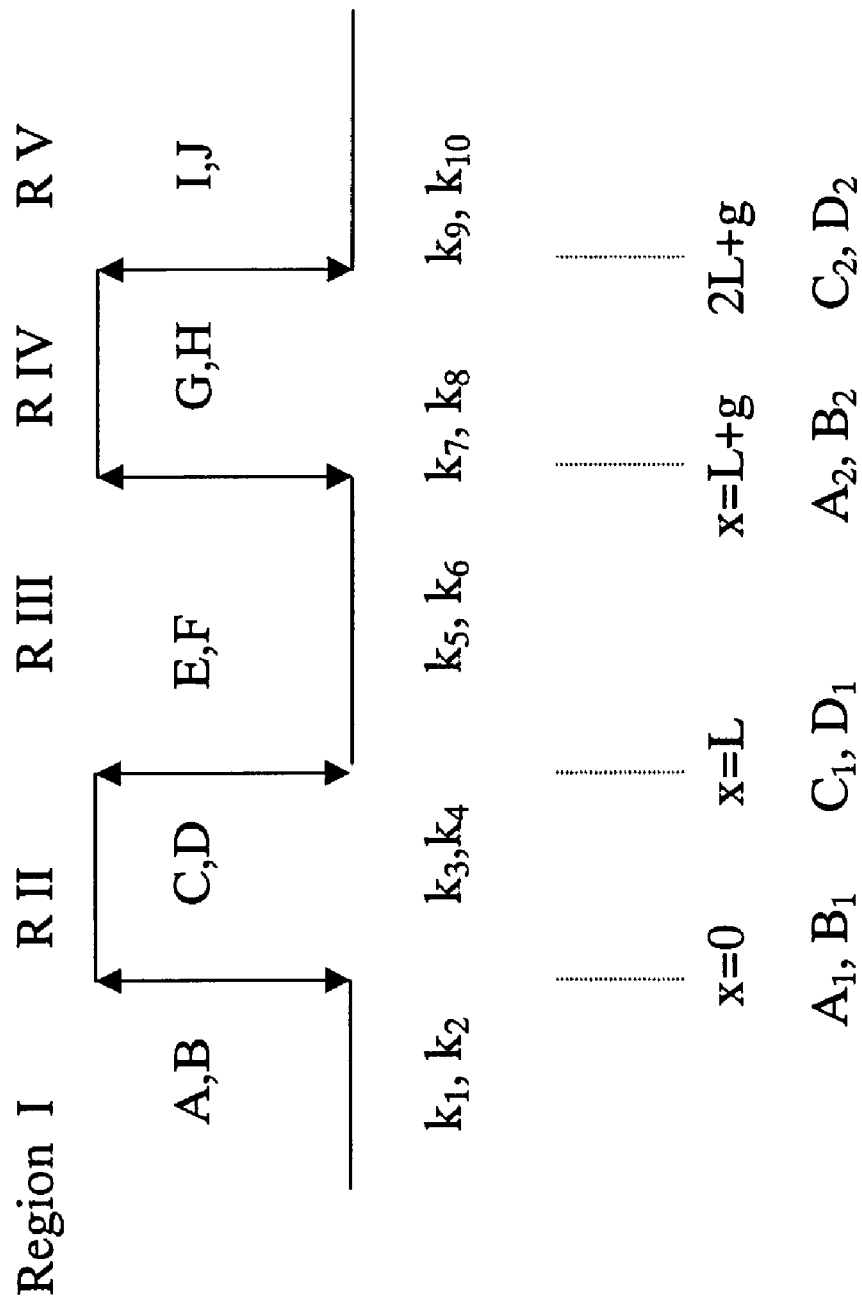
FIG. 6 shows a schematic illustration of a double pair which acts as the basic unit of multiple barrier pairs.

Transmission matrices components for one double-pair magneto-electric barrier are shown below:

$$\begin{bmatrix} A \\ B \end{bmatrix} = \begin{bmatrix} \frac{[ik_3 - ik_2 - Z]}{i(k_1 - k_2)} & \frac{[ik_4 - ik_2 - Z]}{i(k_1 - k_2)} \\ \frac{[ik_1 - ik_3 + Z]}{i(k_1 - k_2)} & \frac{[ik_1 - ik_4 + Z]}{i(k_1 - k_2)} \end{bmatrix} \begin{bmatrix} C \\ D \end{bmatrix}$$

$$\begin{bmatrix} C \\ D \end{bmatrix} = \begin{bmatrix} \frac{\begin{bmatrix} ik_5 - \\ ik_4 - \\ Z \end{bmatrix}}{i(k_3 - k_4)}\exp i(k_5 - k_3)L & \frac{\begin{bmatrix} ik_6 - \\ ik_4 - \\ Z \end{bmatrix}}{i(k_3 - k_4)}\exp i(k_6 - k_3)L \\ \frac{\begin{bmatrix} ik_3 - \\ ik_5 + \\ Z \end{bmatrix}}{i(k_3 - k_4)}\exp i(k_5 - k_4)L & \frac{\begin{bmatrix} ik_3 - \\ ik_6 + \\ Z \end{bmatrix}}{i(k_3 - k_4)}\exp i(k_6 - k_4)L \end{bmatrix} \begin{bmatrix} E \\ F \end{bmatrix}$$

$$\begin{bmatrix} E \\ F \end{bmatrix} = \begin{bmatrix} \frac{\begin{bmatrix} ik_7 - \\ ik_6 - \\ Z \end{bmatrix}}{i(k_5 - k_6)}\exp i\left(\frac{k_7 -}{k_5}\right)\left(\frac{L+}{g}\right) & \frac{\begin{bmatrix} ik_8 - \\ ik_6 - \\ Z \end{bmatrix}}{i(k_5 - k_6)}\exp i\left(\frac{k_8 -}{k_5}\right)\left(\frac{L+}{g}\right) \\ \frac{\begin{bmatrix} ik_5 - \\ ik_7 + \\ Z \end{bmatrix}}{i(k_5 - k_6)}\exp i\left(\frac{k_7 -}{k_6}\right)\left(\frac{L+}{g}\right) & \frac{\begin{bmatrix} ik_5 - \\ ik_8 + \\ Z \end{bmatrix}}{i(k_5 - k_6)}\exp i\left(\frac{k_8 -}{k_6}\right)\left(\frac{L+}{g}\right) \end{bmatrix} \begin{bmatrix} G \\ H \end{bmatrix}$$

$$\begin{bmatrix} G \\ H \end{bmatrix} = \begin{bmatrix} \frac{\begin{bmatrix} ik_9 - \\ ik_8 - \\ Z \end{bmatrix}}{i(k_7 - k_8)}\exp i\left(\frac{k_9 -}{k_7}\right)\left(\frac{2L+}{g}\right) & \frac{\begin{bmatrix} ik_{10} - \\ ik_8 - \\ Z \end{bmatrix}}{i(k_7 - k_8)}\exp i\left(\frac{k_{10} -}{k_5}\right)\left(\frac{2L+}{g}\right) \\ \frac{\begin{bmatrix} ik_7 - \\ ik_9 + \\ Z \end{bmatrix}}{i(k_7 - k_8)}\exp i\left(\frac{k_9 -}{k_8}\right)\left(\frac{2L+}{g}\right) & \frac{\begin{bmatrix} ik_7 - \\ ik_{10} + \\ Z \end{bmatrix}}{i(k_7 - k_8)}\exp i\left(\frac{k_{10} -}{k_8}\right)\left(\frac{2L+}{g}\right) \end{bmatrix} \begin{bmatrix} I \\ J \end{bmatrix},$$

wherein $k_i$, L and g are illustrated in FIG. 6.

FIG. 6 shows a schematic illustration of a double pair which acts as the basic unit of the multiple double barrier pairs. Electrical voltages are applied in region II and IV of each double pair. Magnetic barrier configuration of each double pair ensures that the net change in the magnetic vector potential (A) in region IV after passing through the double pair is always 0.

The above transmission matrices components describe the wave-function amplitudes across a double pair magnetic-electric barrier illustrated schematically in FIG. 6.

Furthermore, the conductance G can be found in terms of transmission probability and Fermi energy.

$$G^z = \frac{2e^2}{\hbar^2}m*v_F L_y \int_{-\pi/2}^{\pi/2} T^\pm(E_F, \sqrt{E_F}\sin\phi)\cos\phi d\phi$$

Figure 7:
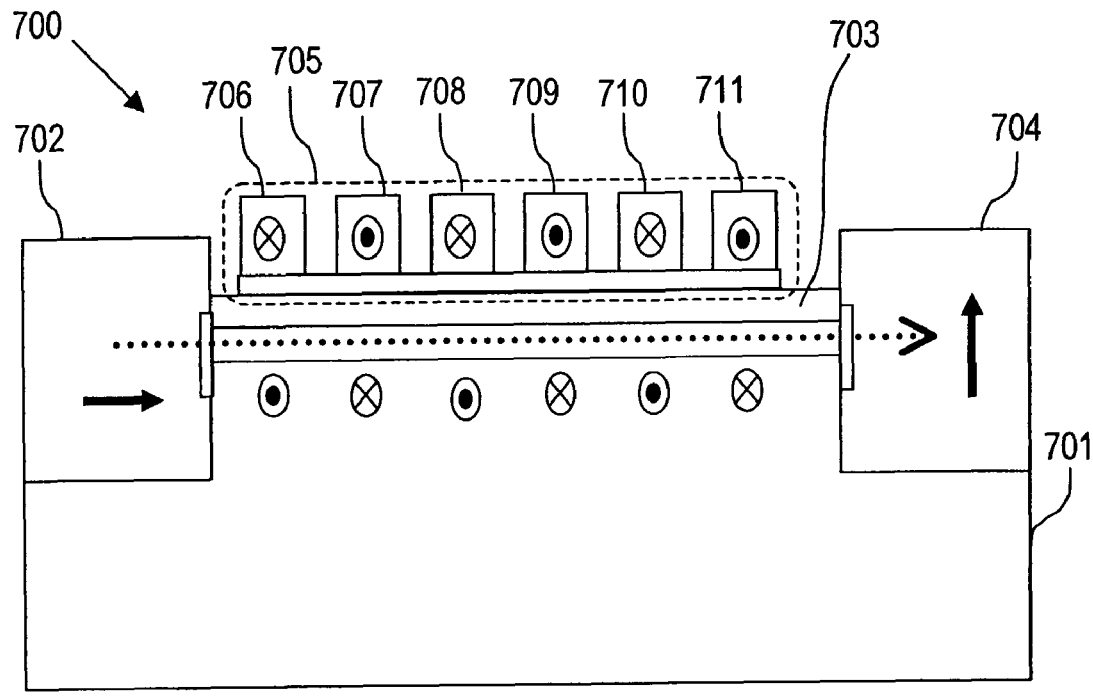
FIG. 7 shows a schematic illustration of a magneto-electric barrier field effect transistor according to another embodiment of the present invention.
Figure 7:
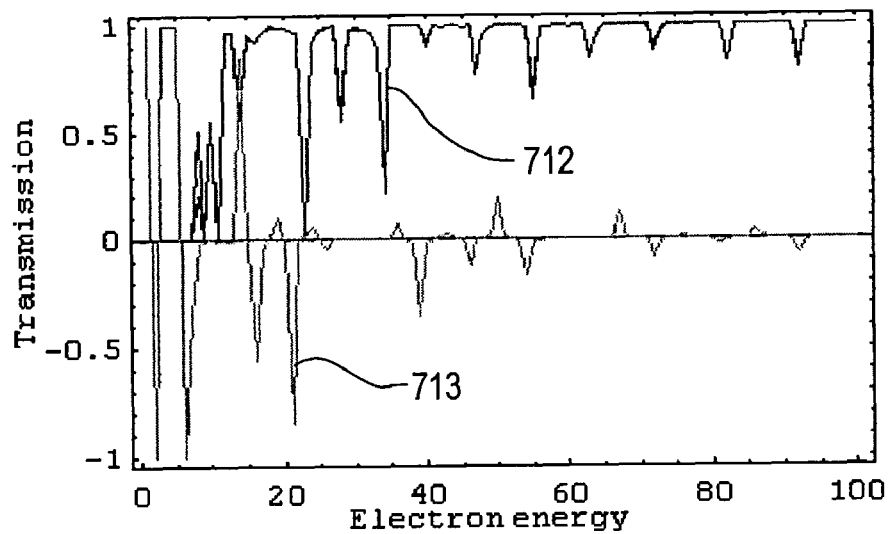

FIG. 7 shows a schematic illustration of a magneto-electric barrier field effect transistor according to another embodiment of the present invention. According to the embodiment schematically depicted in FIG. 7a a magneto-electric barrier field effect transistor 700 comprises a substrate 701, a source 702, a channel region 703 adapted to generate a 2DEG, and a drain 704. Further the magneto-electric barrier field effect transistor 700 comprises a gate 705 comprising a patterned media with six elements 706, 707, 708, 709, 710 and 711. The number of six is for illustrative purposes only and the magneto-electric barrier field effect transistor according to this embodiment is not limited to six elements. Preferably, the elements are grouped as magnetic double pair elements, i.e. the number of elements is a multiple of four. The elements 706, 707, 708, 709, 710 and 711 are adapted to induce a magnetic field into the channel region 703, wherein the magnetization direction is in the direction parallel to an interface surface between the gate and the channel region and perpendicular to a line leading from source to drain, i.e. perpendicular to the direction of the traveling electrons. Thus, the magnetic field is a $B_y$ field and schematically shown with the schematic arrows leading into and out of the paper plane. Further, in FIG. 7b the results of simulations for calculating the transmission probability 712 (darker lines) and the resulting spin polarization 713 (lighter lines) for different electron energies is shown, which results of simulations are similar to the simulations shown in FIG. 5.

Figure 8:
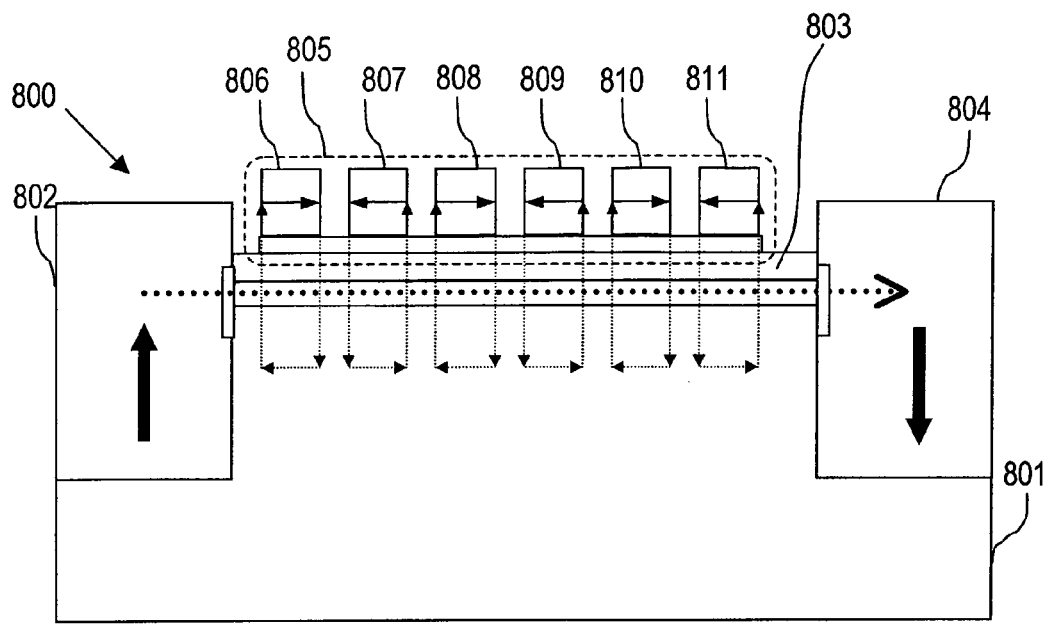
FIG. 8 shows a schematic illustration of an amplifier comprising a magneto-electric barrier field effect transistor according to the present invention and the resulting spin polarization for different electron energies and different voltages applied to the gate.
Figure 8:
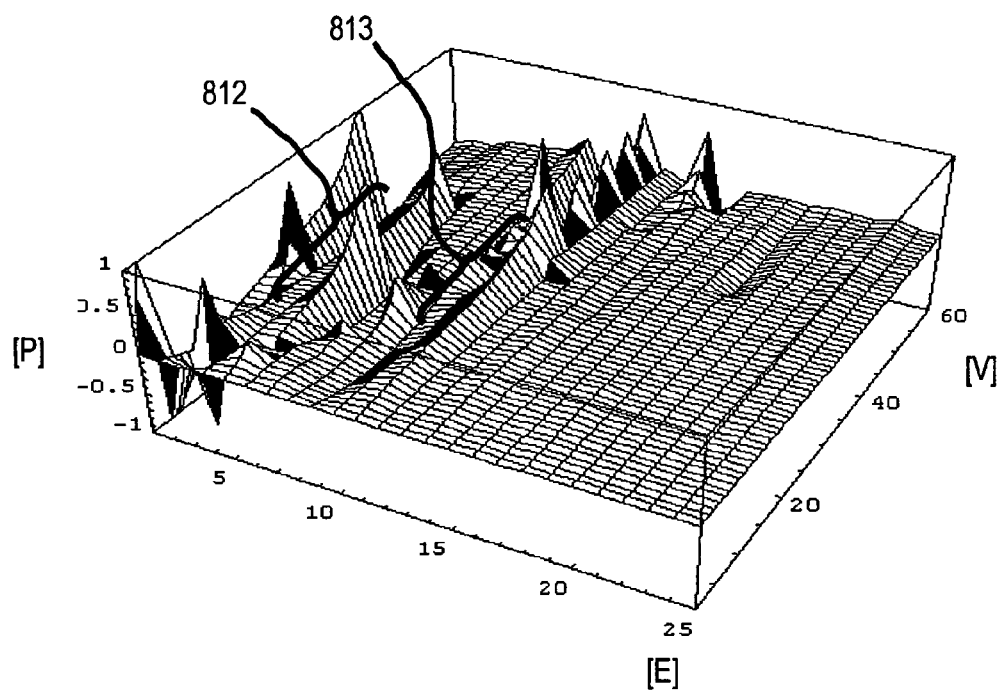

FIG. 8 shows a schematic illustration of a magneto-electric barrier field effect transistor according to an embodiment of the present invention. According to the embodiment schematically depicted in FIG. 8a a magneto-electric barrier field effect transistor 800 comprises a substrate 801, a source 802, a channel region 803 adapted to generate a 2DEG, and a drain 804. Further the magneto-electric barrier field effect transistor 800 comprises a gate 805, comprising a patterned media with six elements 806, 807, 808, 809, 810 and 811. The number of six is for illustrative purposes only and the magneto-electric barrier field effect transistor according to this embodiment is not limited to six elements. Preferably, the elements are grouped as magnetic double pair elements, i.e. the number of elements is multiple of four. The elements 806, 807, 808, 809, 810 and 811 are adapted to induce a magnetic field into the channel region 803, wherein the magnetization direction is in the direction perpendicular to an interface surface between the gate and the channel region and perpendicular to a line leading from source to drain, i.e. perpendicular to the direction of the traveling electrons. Thus, the magnetic field is a $B_z$ field and schematically shown with the schematic arrows leading from left to right or from right to left.

Further, in FIG. 8b the results of simulations for calculating the spin polarization P for different electron energies E and different gate voltages V are shown as a three dimensional plot. The three dimensional plot shows that for certain electron energies, for example 5 E0 and 10 E0, wherein 10 E0 is approximately the Fermi energy, the spin polarization P has a substantially linear dependence on the gate voltage V. The substantially linear portions are marked with the brackets 812 and 813 in FIG. 8. The substantially linear portion extends from about 20 to 35 of the gate voltage for E=5 E0, wherein the numbers for the gate voltage are in arbitrary units. The substantially linear portion extends from about 20 to 45 of the gate voltage for E=10 E0, wherein the numbers for the gate voltage are in arbitrary units. Due to this substantially linear dependence the magneto-electric barrier field effect transistor can be used as an amplifier which is sensitive to small voltage change and exhibit a substantially linear increase of the spin polarization with increasing gate voltage, which polarization can be converted to voltage.

Another spintronic device which can be embodied by a magneto-electric barrier field effect transistor according to the present invention is a non-volatile memory cell a schematic structure of which is shown in FIG. 9. A magneto-electric barrier field effect transistor 900 of a non-volatile memory cell comprises a substrate 901, a source 902, a channel region 903 adapted to generate a 2DEG, and a drain 904. Further, the magneto-electric barrier field effect transistor 900 comprises a gate 905, comprising a first element 906 inducing a fixed magnetization into the channel region and a second element 907 inducing a switchable magnetic field into the channel region. The first element 906 and the second element 907 compose a magnetic double pair element. A length of the first element 906 and the second element 907 along the line between the source and the drain is preferably the same.

In FIG. 9a the magneto-electric barrier field effect transistor 900 is shown in the high resistance state, while in FIG. 9b the magneto-electric barrier field effect transistor 900 is shown in the low resistance state. The magneto-electric barrier field effect transistor 900 can be switched between these two states by switching the second element 907, so that the direction of the magnetic field of the second element 907 is inverted. The inversion of the direction of the magnetic field is schematically depicted as an arrow 908 which is directed in FIG. 9a to the left, whereas the arrow 908 is directed to the right in FIG. 9b. In FIG. 9c and FIG. 9d the resulting spin polarization for different electron energies and number of barriers, i.e. the number of magnetic double pair elements is shown. FIG. 9c shows that for the high resistance state the magneto-electric barrier field effect transistor 900 of FIG. 9a exhibit a spin polarization for an electron energy of 10 E0, which is approximately the Fermi energy. The value of the spin polarization increases with the number of barriers. FIG. 9d shows that for the low resistance state the magneto-electric barrier field effect transistor 900 of FIG. 9b exhibit a spin polarization which is zero.

Whereas the non-volatile memory cell schematically depicted in FIG. 9 is based on changing the spin polarization of electrons passing through the channel region a non-volatile memory cell schematically depicted in FIG. 10 is of a transmission threshold type.

A magneto-electric barrier field effect transistor 1000 of a non-volatile memory cell comprises a substrate 1001, a source 1002, a channel region 1003 adapted to generate a 2DEG, and a drain 1004. Further, the magneto-electric barrier field effect transistor 1000 comprises a gate 1005, comprising a first element 1006 inducing a fixed magnetization into the channel region 1003, a second element 1007 inducing a switchable magnetic field into the channel region 1003, a third element 1008 inducing a fixed magnetization into the channel region 1003 and a fourth element 1009 inducing a switchable magnetic field into the channel region 1003. Furthermore, the non-volatile memory cell comprises a soft magnetic underlayer 1010. The first element 1006, the second element 1007, the third element 1008 and the fourth element 1009 compose a magnetic double pair element and the magnetization is of a perpendicular type, i.e. the elements 1006, 1007, 1008 and 1009 are aligned such that a line between north and south pole of each single element is substantially perpendicular to the plane of the channel region 1003, which is schematically indicated by the arrows shown in FIG. 10.

In FIG. 10a the magneto-electric barrier field effect transistor 1000 is shown in the low transmission threshold state or high current state, i.e. in the state where the magnetization induced by the second element 1007 and the fourth element 1009 is antiparallel to the magnetization induced by the first element 1006 and the third element 1008, while in FIG. 10c the magneto-electric barrier field effect transistor 1000 is shown in the high transmission threshold state or low current state, i.e. in the state where the magnetization induced by the second element 1007 and the fourth element 1009 is parallel to the magnetization induced by the first element 1006 and the third element 1008. The magneto-electric barrier field effect transistor 1000 can be switched between these two states by switching the second element 1007 and the fourth element 1009, so that the direction of the magnetic field of the second element 1007 and the fourth element 1007 is inverted. In FIG. 10b and FIG. 10d the resulting transmission probability for different electron energies and number of barriers, i.e. the number of magnetic double pair elements, is shown. FIG. 10b shows that for the low transmission threshold state the magneto-electric barrier field effect transistor 1000 of FIG. 10a exhibits a threshold of approximately 10 E0, which is approximately the Fermi energy. This threshold is approximately independent of the number of barriers. FIG. 10d shows that for the high transmission threshold state the magneto-electric barrier field effect transistor 1000 of FIG. 10b exhibits a much higher transmission threshold compared to FIG. 10b. The transmission threshold is strongly dependent on the number of barriers.

FIG. 11 shows a schematic illustration of a programmable AND/NAND gate according to an embodiment of the present invention. A magneto-electric barrier field effect transistor 1100 of an AND/NAND gate comprises a substrate 1101, a source 1102, a channel region 1103 adapted to generate a 2DEG, and a drain 1104. Further, the magneto-electric barrier field effect transistor 1100 comprises a gate 1105, comprising a first element 1106 inducing a fixed magnetization into the channel region 1103, a second element 1107 inducing a switchable magnetic field into the channel region 1103, a third element 1108 inducing a fixed magnetization into the channel region 1103 and a fourth element 1109 inducing a switchable magnetic field into the channel region 1103. Furthermore; the non-volatile memory cell comprises a soft magnetic underlayer 1110. The first element 1106, the second element 1107, the third element 1108 and, the fourth element 1109 compose a magnetic double pair element and the magnetization is of a perpendicular type, i.e. the elements 1106, 1107, 1108 and 1109 are aligned such that a line between north and south pole of each single element is substantially perpendicular to the plane of the channel region 1103, which is schematically indicated by the arrows shown in FIG. 11. Furthermore, an Input 1 and an Input 2 is schematically shown in connection with the second element 1107 and the fourth element 1109, respectively.

By using different signals for Input 1 and Input 2 the AND/NAND gate of FIG. 11 different states can be realized. As an example an AND gate can be embodied by using the transmission thresholds for different signals on Input 1 and on Input 2. For example, an output, i.e. the transmission of electrons through the channel region, can be set as: Low (0), when a signal Low (0) is applied to Input 1 and Input 2, Low (0) when a signal Low is applied to Input 1 and a signal High (1) is applied to Input 2, Low (0) when a signal High (1) is applied to Input 1 and a signal Low (0) is applied to Input 2, and High (1) when a signal High (1) is applied to Input 1 and Input 2. Thus, a logic AND gate can be embodied by the programmable AND/NAND gate according to the embodiment of the present invention shown in FIG. 11.

Summarizing, an aspect of the inventive idea can be seen in using a gate comprising at least one magnetic double pair element to induce magnetic delta barriers into a HEMT like channel region of a magneto-electric barrier field-effect transistor. The magnetic double pair element induces a perpendicular magnetic field of net zero A-type into the HEMT like channel region of the magneto-electric barrier field-effect transistor. Furthermore, an electric potential is applied to the gate of the magneto-electric barrier field-effect transistor. The described structure of the magneto-electric barrier field-effect transistor secures that the polarization of polarized electrons which are injected into the HEMT like channel region is increased. Even for permanent B-fields induced by permanent magnets, a degree of flexibility in control of the spin polarization exists, since the multiple magnetic delta barriers can be initialized and changed with different magnetization configurations. Additionally, a current through a write line positioned in the vicinity of the gate can be used to change the magnetization of the gate.

Although the present invention and its advantages have been described in detail, it should be understood that various changes, substitutions and alterations can be made herein without departing from the spirit and scope of the invention as defined in the appended claims.

In this application, the following documents are cited:
[1] Supriyo Datta, and Biswajit Das, Appl. Phys. Lett. 56 (7), 665 (1989)
[2] Amlan Majumdar, Phys. Rev. B 54, 11911 (1996)
[3] Yong Guo, Binglin Gu, and Wenhui Duan, Yu Zhang, Phys. Rev. B 55, 9314 (1997)
[4] G. Papp, F. M. Peeters, Appl. Phys. Lett. 78, 2184 (2001)
[5] H. Z. Xu and Y. Okada, Appl. Phys. Lett. 79, 3119 (2001)
[6] Y. Jiang, Jalil MBA, and T. S. Low, Appl. Phys. Lett. 80, 1673 (2002)
[7] Yong Guo, Jian-Hua Qin, Xn-Yi Chen, and Bing-Lin Gu, Semicond. Sci. Technol. 18, 297-299 (2003)
[8] Takaaki Koga, Junsaku Nitta, Tatsushi Akazaki, and Hideaki Takayanagi, Phys. Rev. Lett. 89, 046801-1 (2002)
[9] P. R. Hammar, B. R. Bennet, M. J. Yang, and Mark Johnson, Phys. Rev. Lett. 83, 203 (1999)
[10] Jun-ichiro Inoue, Gerrit E. W. Bauer, and Laurens W. Molenkamp, Phys. Rev. B 67, 033104 (2003)
[11] E. I. Rashba, and Al. L. Efros, Phys. Rev. Lett. 91, 126405 (2003)
[12] Laurens W. Molenkamp, G. Schmidt, and Gerrit E. W. Bauer, Phys. Rev. B 64, 121202 (R), 2001
[13] John Schliemann, and Daniel Loss, Phys. Rev. B 68, 165311 (2003)
[14] John Schliemann, J. Carlos Egues, and Daniel Loss, Phys. Rev. Lett. 90, 146801-1 (2003)
[15] U.S. Pat. No. 5,654,566
[16] U.S. Pat. No. 6,218,718

What is claimed is:

1. A magneto-electric field effect transistor comprising:
   a High Electron Mobility Transistor (HEMT) like channel region;
   a source connected to one side of the channel region and adapted to inject electrons into the channel region;
   a drain connected to the opposite side of the channel region and adapted to detect spin polarized electrons; and
   a gate comprising at least one magnetic double pair element comprising four magnetic elements, wherein each magnetic element is adapted to induce a magnetic field into the channel region wherein the total induced magnetic field of each magnetic double pair element is controllable to be substantially zero, and wherein the gate is further adapted to induce an electrical field into the channel region.

2. The magneto-electric field effect transistor according to claim 1, wherein the gate comprises a plurality of magnetic double pair elements.

3. The magneto-electric field effect transistor according to claim 1, wherein the source comprises a material selected of the group consisting of non-magnetic, ferromagnetic, half metal, and magnetic semiconductor.

4. The magneto-electric field effect transistor according to claim 1, wherein the drain comprises a material selected of the group consisting of ferromagnetic, half metal, and magnetic semiconductor.

5. The magneto-electric field effect transistor according to claim 1, wherein the channel region comprises a first layer consisting of n⁺ doped Aluminum-Gallium-Arsenic, a second layer consisting of Aluminum-Gallium-Arsenic, and a third layer consisting of Gallium-Arsenic.

6. The magneto-electric field effect transistor according to claim 1, wherein the gate comprises a ferromagnetic material.

7. The magneto-electric field effect transistor according to claim 6, wherein the ferromagnetic material is an alloy of Cobalt-Chromium-Platinum and/or Iron-Platinum and/or Iron-Cobalt and/or Cobalt-Palladium.

8. The magneto-electric field effect transistor according to claim 1, wherein the gate comprises at least ten magnetic double pair elements.

9. The magneto-electric field effect transistor according to claim 1, wherein the magnetic double pair element is formed by magnets the poles of which are aligned substantially parallel to the channel region.

10. The magneto-electric field effect transistor according to claim 1, wherein the magnetic double pair element is formed by magnets the poles of which are aligned substantially perpendicular to the channel region.

11. The magneto-electric field effect transistor according to claim 1, wherein the gate comprises single pole writing heads, which are adapted to influence the magnetic field induced by the magnetic double pair element into the channel region.

12. The magneto-electric field effect transistor according to claim 1, wherein the magneto-electric field effect transistor further comprises a layer of soft magnetic material below the channel region opposite to the gate.

13. The magneto-electric field effect transistor according to claim 1, wherein the strength of the magnetic field induced by the first magnetic delta barrier is $B_1$, the strength of the magnetic field induced by the second magnetic delta barrier is $B_2$, the strength of the magnetic field induced by the third magnetic delta barrier is $B_3$, the strength of the magnetic field induced by the forth magnetic delta barrier is $B_4$, and wherein $B_1$, $B_2$, $B_3$, and $B_4$ have the following relation to each other:

$$|B_2|=|B_3|, |B_1|=|B_4| \text{ and } |B_1| \neq |B_2|.$$

14. The magneto-electric field effect transistor according to claim 1, wherein the strength of the magnetic field induced by the first magnetic delta barrier is $B_1$, the strength of the magnetic field induced by the second magnetic delta barrier is $B_2$, the strength of the magnetic field induced by the third magnetic delta barrier is $B_3$, the strength of the magnetic field induced by the forth magnetic delta barrier is $B_4$, and wherein $B_1$, $B_2$, $B_3$, and $B_4$ have the following relation to each other:

$$|B_1|=|B_2|, |B_3|=|B_4| \text{ and } |B_1| \neq |B_3|.$$

15. The magneto-electric field effect transistor according to claim 1, wherein the strength of the magnetic field induced by the first magnetic delta barrier is $B_1$, the strength of the magnetic field induced by the second magnetic delta barrier is $B_2$, the strength of the magnetic field induced by the third magnetic delta barrier is $B_3$, the strength of the magnetic field induced by the forth magnetic delta barrier is $B_4$, and wherein $B_1$, $B_2$, $B_3$, and $B_4$ have the following relation to each other:

$$|B_1|=|B_2|=|B_3|=|B_4|.$$

16. The magneto-electric field effect transistor according to claim 1, wherein the gate comprises a patterned layer.

17. The magneto-electric field effect transistor according to claim 1, wherein the induced magnetic field is perpendicular to an interface surface between the gate and the channel region.

18. The magneto-electric field effect transistor according to claim 1, wherein the induced magnetic field is parallel to an interface surface between the gate and the channel region and perpendicular to a line leading from source to drain.

19. The magneto-electric field effect transistor according to claim 1, wherein the magnetic field induced by each magnetic double pair element is zero.

20. An amplifier comprising a magneto-electric field effect transistor according to claim 1.

21. An memory chip comprising a magneto-electric field effect transistor according to claim 1.

22. An AND/NAND gate comprising a magneto-electric field effect transistor according to claim 1.

* * * * *